US008962726B2

(12) United States Patent
Tanaka et al.

(10) Patent No.: US 8,962,726 B2
(45) Date of Patent: Feb. 24, 2015

(54) COMPOUND HAVING BISAZO SKELETON, PIGMENT DISPERSANT CONTAINING THE COMPOUND, PIGMENT COMPOSITION, PIGMENT DISPERSION, INK AND RESIST COMPOSITION FOR COLOR FILTER

(71) Applicant: Canon Kabushiki Kaisha, Tokyo (JP)

(72) Inventors: Masatake Tanaka, Yokohama (JP); Masashi Hirose, Machida (JP); Takayuki Toyoda, Yokohama (JP); Waka Hasegawa, Tokyo (JP); Yasuaki Murai, Kawasaki (JP); Masashi Kawamura, Yokohama (JP); Yuki Hasegawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/343,167

(22) PCT Filed: Oct. 10, 2012

(86) PCT No.: PCT/JP2012/076744
§ 371 (c)(1),
(2) Date: Mar. 6, 2014

(87) PCT Pub. No.: WO2013/054938
PCT Pub. Date: Apr. 18, 2013

(65) Prior Publication Data
US 2014/0235775 A1 Aug. 21, 2014

(30) Foreign Application Priority Data
Oct. 12, 2011 (JP) .................................. 2011-224613

(51) Int. Cl.
C09D 11/17 (2014.01)
(52) U.S. Cl.
USPC ........................... 524/189; 525/153; 526/208
(58) Field of Classification Search
USPC ........................... 524/189; 525/153; 526/208
See application file for complete search history.

(56) References Cited

U.S. PATENT DOCUMENTS

| 6,099,631 | A  | 8/2000 | Tregub et al. |
| 6,479,648 | B1 | 11/2002 | Xia et al. |
| 6,512,081 | B1 | 1/2003 | Rizzardo et al. |
| 7,250,479 | B2 | 7/2007 | Le et al. |
| 7,348,367 | B2 | 3/2008 | Thetford et al. |
| 7,582,152 | B2 | 9/2009 | Jaunky et al. |
| 7,662,986 | B2 | 2/2010 | Le et al. |
| 7,666,962 | B2 | 2/2010 | Le et al. |
| 7,714,075 | B1 | 5/2010 | Le et al. |
| 8,080,067 | B2 | 12/2011 | Tateishi et al. |
| 8,153,706 | B2 | 4/2012 | Vasudevan |
| 8,546,502 | B2 | 10/2013 | Shimanaka et al. |
| 2006/0089421 | A1 | 4/2006 | Vasudevan |
| 2010/0029840 | A1 | 2/2010 | Morimoto |
| 2013/0122413 | A1 | 5/2013 | Tanaka et al. |
| 2013/0130164 | A1 | 5/2013 | Murai et al. |

FOREIGN PATENT DOCUMENTS

| CN | 101959969 A | 1/2011 | |
| JP | 11-14825 A | 1/1999 | |
| JP | 2000-515181 A | 11/2000 | |
| JP | 2003-531001 A | 10/2003 | |
| JP | 3721617 B2 | 11/2005 | |
| JP | 2006-124704 A | 5/2006 | |
| JP | 4254292 B2 | 4/2009 | |
| JP | 2010-031153 A | 2/2010 | |
| WO | 99/05099 A1 | 2/1999 | |
| WO | 99/42532 A1 | 8/1999 | |
| WO | 02/44283 A2 | 6/2002 | |
| WO | WO 02/44283 A2 * | 6/2002 | |
| WO | 2007/006637 A2 | 1/2007 | |
| WO | WO 2007/006637 A2 * | 1/2007 | ............. C09B 67/20 |
| WO | 2009/060886 A1 | 5/2009 | |
| WO | 2009/157536 A1 | 12/2009 | |

OTHER PUBLICATIONS

Datta E. Ponde et al., "Selective Catalytic Transesterification, Transthiolesterification, and Protection of Carbonyl Compounds over Natural Kaolinitic Clay," 63(4) J. Org. Chem. 1058-1063 (Jan. 1998).
Kiran Kumar Solingapuram Sai et al., "Knorr Cyclizations and Distonic Superelectrophiles," 72(25) J. Org. Chem. 9761-9764 (Nov. 2007).
Krzysztof Matyjaszewski et al., "Atom Transfer Radical Polymerization," 101(9) Chem. Rev. 2921-2990 (Sep. 2001).
Craig J. Hawker et al., "New Polymer Synthesis by Nitroxide Mediated Living Radical Polymerizations," 101(12) Chem. Rev. 3661-3688 (Oct. 2001).
Masami Kamigaito et al., "Metal-Catalyzed Living Radical Polymerization," 101(12) Chem. Rev. 3689-3746 (Dec. 2001).
Atsushi Goto et al., "Mechanism-Based Invention of High-Speed Living Radical Polymerization Using Organotellurium Compounds and Azo-Initiators," 125(29) J. Am. Chem. Soc. 8720-8721 (Jun. 2003).
John Sheehan et al., "A Convenient Synthesis of Water-Soluble Carbodiimides," 26 (7) J. Org. Chem. 2525-2528 (Jul. 1961).
Norman O.V. Sonntag, "The Reactions of Aliphatic Acid Chlorides," 52(2) Chem. Rev. 237-416 (Apr. 1953).
Jikken Kagaku Koza (Experimental Chemistry Guide Book), Maruzen Co., Ltd., 2nd edition, vol. 17-2, pp. 162-179 (1964).
Shin Jikken Kagaku Kozo (New Experimental Chemistry Guide Book), Maruzen Co., Ltd., 1st edition, vol. 15, pp. 390-448 (1985).
Office Action in Chinese Application No. 201280050171.4 (issued Nov. 28, 2014).

* cited by examiner

Primary Examiner — Robert D. Harlan
(74) Attorney, Agent, or Firm — Fitzpatrick, Cella, Harper & Scinto

(57) ABSTRACT

An object of the present invention is to provide a pigment dispersant in which dispersibility of an azo pigment in a water-insoluble solvent is improved, and to provide an azo pigment composition in which the azo pigment has high dispersibility in a water-insoluble solvent. The present invention provides a compound used as a pigment dispersant and having a structure in which a specific bisazo skeleton unit bonds to a specific polymer resin unit.

12 Claims, 2 Drawing Sheets

COMPOUND HAVING BISAZO SKELETON, PIGMENT DISPERSANT CONTAINING THE COMPOUND, PIGMENT COMPOSITION, PIGMENT DISPERSION, INK AND RESIST COMPOSITION FOR COLOR FILTER

TECHNICAL FIELD

The present invention relates to a novel compound having a bisazo skeleton unit, a pigment dispersant containing the compound, a pigment composition, and a pigment dispersion. Further, the present invention relates to an ink and a resist composition for a color filter using the pigment dispersion as a colorant.

BACKGROUND ART

If the pigment is made fine in order to improve spectral characteristics of the pigment such as a coloring power and transparency, the fine pigment is likely to cause crystal growth or dislocations due to a thermal history or contact with a solvent in a dispersing step or a production step subsequent thereto, undesirably reducing the coloring power or the transparency.

In order to improve the dispersibility of the pigment, various pigment compositions and pigment dispersants that form the pigment compositions have been proposed. For example, an example using a comb polymer dispersant having an acid or basic site known as Solsperse (registered trademark) has been disclosed (see PTL 1). Further, another example using a polymer dispersant as a dispersant for an azo pigment in an inkjet recording method has been disclosed in which a chromophore whose molecular weight is less than 95% of the molecular weight of the azo pigment is bonded to a side chain or a terminal of a water-soluble polymer (see PTL 2).

Meanwhile, in R (red), G (green), and B (blue) color filters using organic pigments, two or more pigments are toned and used in order to obtain required color properties. Particularly, in the case of the green color filter, an example has been described in which an azo-based yellow pigment as a toning color is used in a copper phthalocyanine-based green pigment as the main pigment (see PTL 3).

CITATION LIST

Patent Literature

PTL 1: WO 99-42532
PTL 2: U.S. Pat. No. 7,582,152
PTL 3: Japanese Patent Application Laid-Open No. H11-14825

SUMMARY OF INVENTION

Technical Problem

Unfortunately, the pigment dispersant described in PTL 1 has insufficient affinity with the azo pigment, resulting in insufficient dispersibility of the pigment. A water-soluble polymer is used in the pigment dispersant described in PTL 2, resulting in insufficient dispersibility of the pigment when a water-insoluble solvent is used as a disperse medium.

In the case where the azo pigment is used for the resist for a color filter, the pigment has inferior dispersibility, and is difficult to stably disperse. For this reason, the color properties of the color filter are reduced.

Accordingly, an object of the present invention is to provide a pigment dispersant having high affinity with an azo pigment, particularly high affinity with an acetoacetanilide pigment and improving dispersibility of the pigment in a water-insoluble solvent. Further, another object of the present invention is to provide a pigment composition having good dispersibility in a water-insoluble solvent. Another object of the present invention is to provide a pigment dispersion well dispersed in a water-insoluble solvent. Another object of the present invention is to provide an ink and a resist composition for a color filter using the pigment dispersion in which the pigment is well dispersed and color properties are high.

Solution to Problem

The objects above are solved by the present invention. Namely, the present invention provides a compound wherein a unit represented by formula (1) or formula (2):

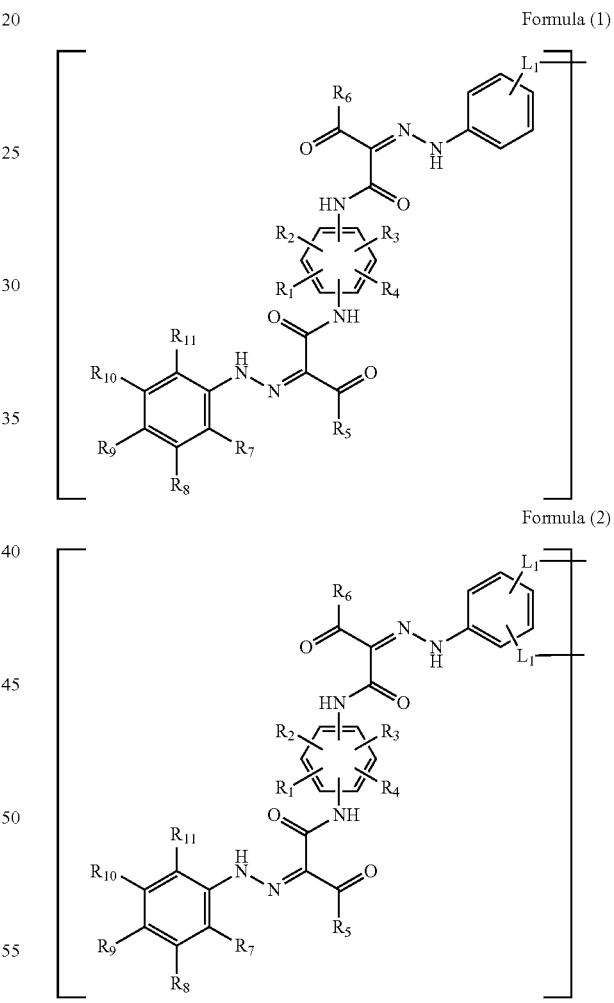

Formula (1)

Formula (2)

[wherein
$R_1$ to $R_4$ represent a hydrogen atom or a halogen atom,
$R_5$ and $R_6$ represent an alkyl group having 1 to 6 carbon atoms or a phenyl group,
$R_7$ to $R_{11}$ represent a hydrogen atom, a $COOR_{12}$ group, or a $CONR_{13}R_{14}$ group, at least one of $R_7$ to $R_{14}$ is the $COOR_{12}$ group or the $CONR_{13}R_{14}$ group, and $R_{12}$ to $R_{14}$ represent a hydrogen atom or an alkyl group having 1 to 3 carbon atoms, and $L_1$ represents a divalent linking group]
bonds to a polymer unit having at least one of a partial structure represented by formula (3) and a partial structure represented by formula (4):

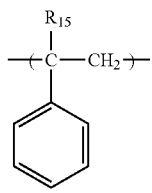

Formula (3)

[wherein $R_{15}$ represents a hydrogen atom or an alkyl group]

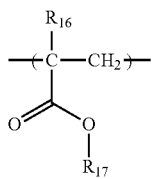

Formula (4)

[wherein $R_{16}$ represents a hydrogen atom or an alkyl group, and $R_{17}$ represents a hydrogen atom, an alkyl group, or an aralkyl group].

Moreover, the present invention provides a pigment dispersant, pigment composition, and pigment dispersion containing the thus-configured compound. Further, the present invention provides an ink and a resist composition for a color filter using the pigment dispersion as a colorant.

Advantageous Effects of Invention

The present invention provides a novel compound having a bisazo skeleton unit. The compound according to the present invention provides a pigment composition having high affinity with a water-insoluble solvent, particularly a nonpolar solvent, having high affinity with an azo pigment, particularly an acetoacetanilide pigment, and providing good dispersibility of the azo pigment, and particularly improving dispersibility of C.I. Pigment Yellow 155 when the compound is used as a pigment dispersant. By using the pigment composition as the pigment dispersant, a pigment dispersion having high dispersibility in a water-insoluble solvent is provided. Further, if the pigment dispersion is contained, an ink and a resist composition for a color filter having good dispersibility of the pigment and high color properties are provided.

Further features of the present invention will become apparent from the following description of exemplary embodiments with reference to the attached drawings.

DESCRIPTION OF EMBODIMENTS

Figure 1:
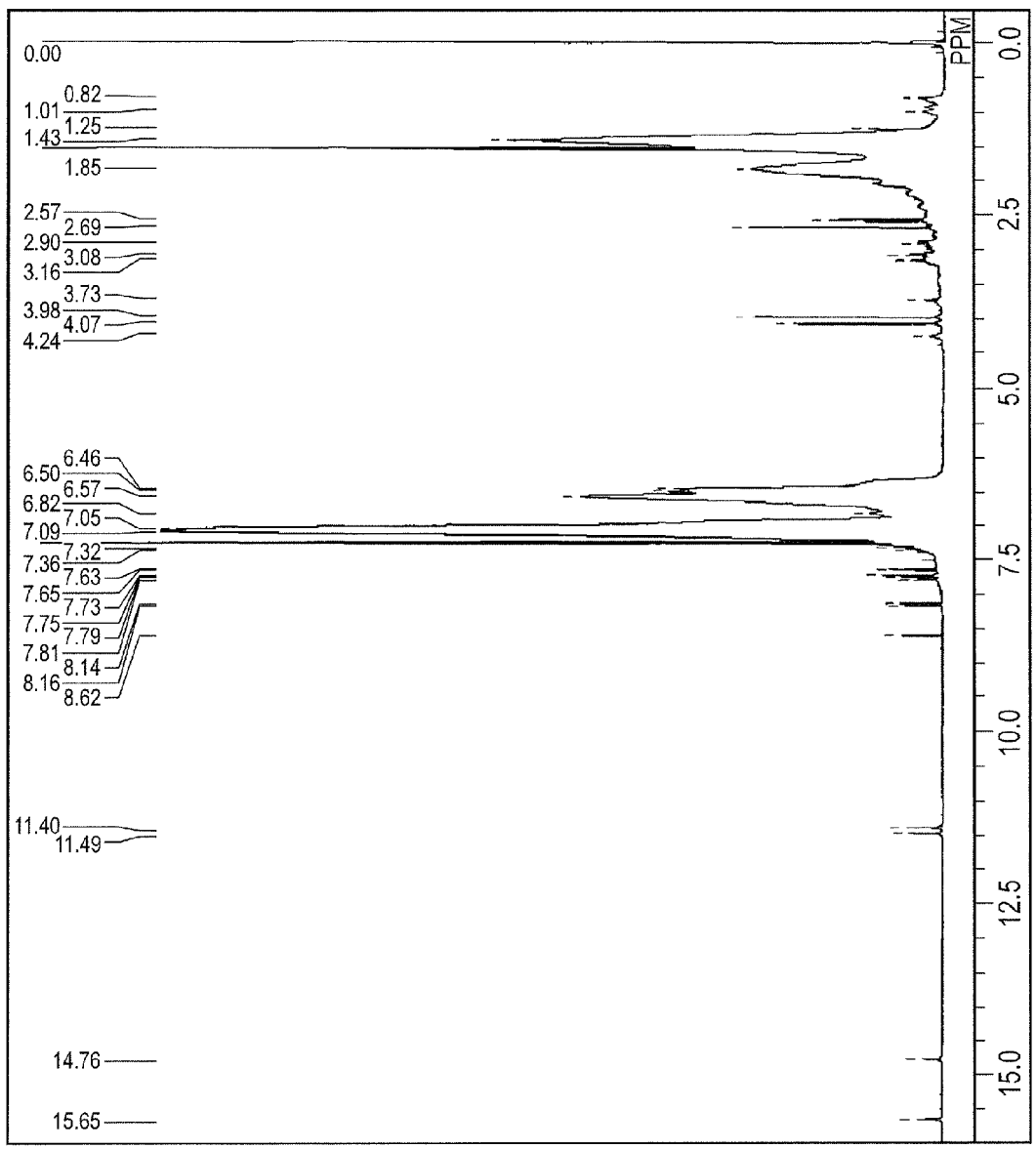
FIG. 1 is a drawing illustrating a $^1$H NMR spectrum at room temperature and 400 MHz of a compound (25) having a bisazo skeleton unit according to the present invention in CDCl$_3$.

Hereinafter, the present invention will be specifically described using a suitable embodiment.

First, the configuration of the compound having a bisazo skeleton unit according to the present invention will be described. The compound having a bisazo skeleton unit according to the present invention has a structure in which the unit represented by formula (1) or formula (2) (also referred to as a "bisazo skeleton unit") bonds to a polymer unit (also referred to as a "polymer resin unit") having at least one of the partial structure represented by formula (3) and the partial structure represented by formula (4). The unit represented by formula (1) and the unit represented by formula (2) have high affinity with the azo pigment, and the partial structure represented by formula (3) and the partial structure represented by formula (4) have high affinity with a water-insoluble solvent.

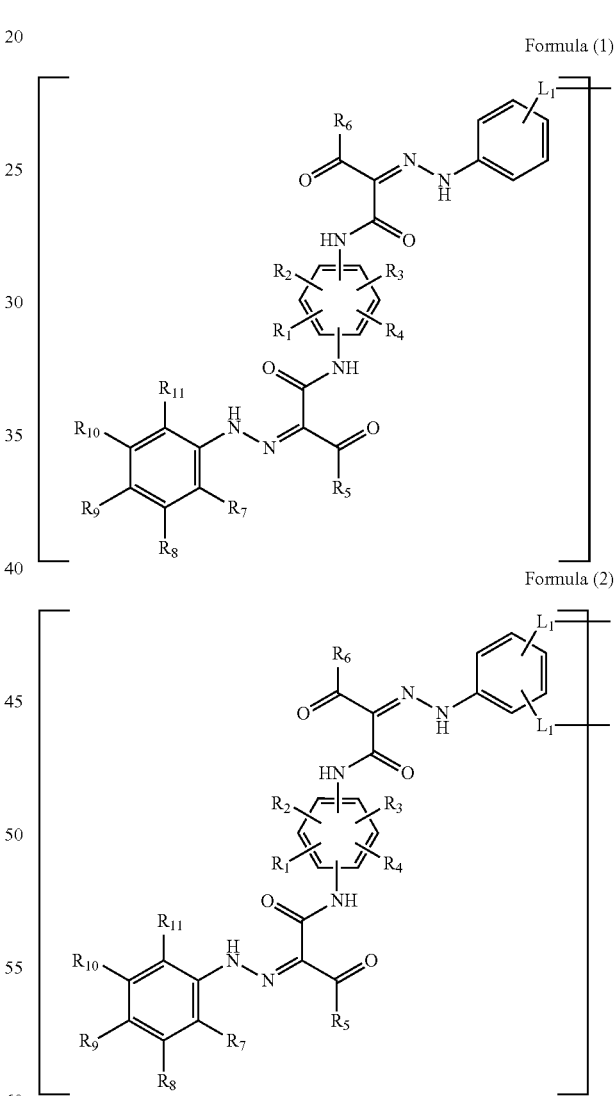

[wherein
$R_1$ to $R_4$ represent a hydrogen atom or a halogen atom,
$R_5$ and $R_6$ represent an alkyl group having 1 to 6 carbon atoms or a phenyl group, $R_7$ to $R_{11}$ represent a hydrogen atom, a COOR$_{12}$ group, or a CONR$_{13}$R$_{14}$ group, at least one of $R_7$ to $R_{11}$ is a COOR$_{12}$ group or a CONR$_{13}$R$_{14}$ group, and $R_{12}$ to $R_{14}$ represent a hydrogen atom or an alkyl group having 1 to 3 carbon atoms, $L_1$ represents a divalent linking group]

bonds to a polymer unit having at least one of a partial structure represented by formula (3) and a partial structure represented by formula (4) (also referred to as a "polymer resin unit"):

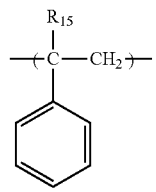

Formula (3)

[wherein $R_{15}$ represents a hydrogen atom or an alkyl group]

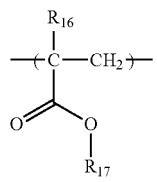

Formula (4)

[wherein $R_{16}$ represents a hydrogen atom or an alkyl group, and $R_{17}$ represents a hydrogen atom, alkyl group, or an aralkyl group].

The configuration of the compound having a bisazo skeleton unit represented by formula (1) or formula (2) will be described. The compound having the bisazo skeleton unit includes a bisazo skeleton unit represented by formula (1) or (2) and having high affinity with the azo pigment, and a polymer resin unit having at least one of a monomer unit represented by formula (3) and a monomer unit represented by formula (4) and having high affinity with the water-insoluble solvent.

First, the bisazo skeleton unit represented by formula (1) or (2) will be specifically described.

In formula (1) or (2), examples of a halogen atom in $R_1$ to $R_4$ include a fluorine atom, a chlorine atom, a bromine atom, and an iodine atom.

$R_1$ to $R_4$ in formula (1) or (2) are preferably a hydrogen atom from the viewpoint of affinity with the pigment.

Examples of substitution positions of $R_1$ to $R_4$ and two acylacetamide groups in formula (1) or (2) include substitution of the acylacetamide groups at the o-position, the m-position, and the p-position. With respect to the affinity with the pigment derived from the difference in the substitution position, the highest affinity is obtained in the case of substitution of the acylacetamide groups at the p-position.

In formula (1) or (2), an alkyl group in $R_5$ and $R_6$ is not particularly limited as long as the alkyl group has 1 to 6 carbon atoms, and examples thereof include linear, branched, or cyclic alkyl groups such as a methyl group, an ethyl group, an n-propyl group, an n-butyl group, an n-pentyl group, an n-hexyl group, an isopropyl group, an isobutyl group, a sec-butyl group, a tert-butyl group, and a cyclohexyl group.

In formula (1) or (2), another substituent may be substituted for the substituent in $R_5$ and $R_6$ unless the another substituent remarkably inhibits the affinity with the pigment.

In this case, examples of the optionally substituted substituent include a halogen atom, a nitro group, an amino group, a hydroxyl group, a cyano group, and a trifluoromethyl group.

$R_5$ and $R_6$ in formula (1) or (2) can be arbitrarily selected from the substituents listed above. From the viewpoint of the affinity with the pigment, the methyl group is preferred.

In formula (1) or (2), $L_1$ is a divalent linking group, which links the bisazo skeleton unit to the polymer resin unit.

The unit in formula (1) bonds to the polymer resin unit by $L_1$ at one position while the unit in formula (2) bonds to the polymer resin unit at two positions.

$L_1$ in formula (1) or (2) is not particularly limited as long as $L_1$ is a divalent linking group. From the viewpoint of ease of production, preferred are cases where the bisazo skeleton unit bonds to the polymer resin unit to form a carboxylic acid ester bond, a carboxylic acid amide bond, and a sulfonic acid ester bond.

From the viewpoint of the affinity with the pigment, the substitution position of $L_1$ in formula (1) or (2) is preferably the case where at least one $L_1$ is located at the p-position with respect to a hydrazo group.

In formula (1) or (2), $R_7$ to $R_{11}$ are a hydrogen atom, a $COOR_{12}$ group or a $CONR_{13}R_{14}$ group, and at least one of $R_7$ to $R_{11}$ is a $COOR_{12}$ group or a $CONR_{13}R_{14}$ group. From the viewpoint of the affinity with the pigment, preferably, $R_8$ and $R_{11}$ are a $COOR_{12}$ group, and $R_7$, $R_9$, and $R_{10}$ are a hydrogen atom.

Examples of the alkyl group in $R_{12}$ to $R_{14}$ in formula (1) or (2) include a methyl group, an ethyl group, an n-propyl group, and an isopropyl group.

From the viewpoint of the affinity with the pigment, preferably, $R_{12}$ and $R_{13}$ are a methyl group, and $R_{14}$ is a methyl group or a hydrogen atom in $R_{12}$ to $R_{14}$ in formula (1) or (2).

Preferred is the bisazo skeleton unit represented by formula (1), and from the viewpoint of the affinity with the pigment, particularly preferred is the bisazo skeleton having the unit represented by formula (5):

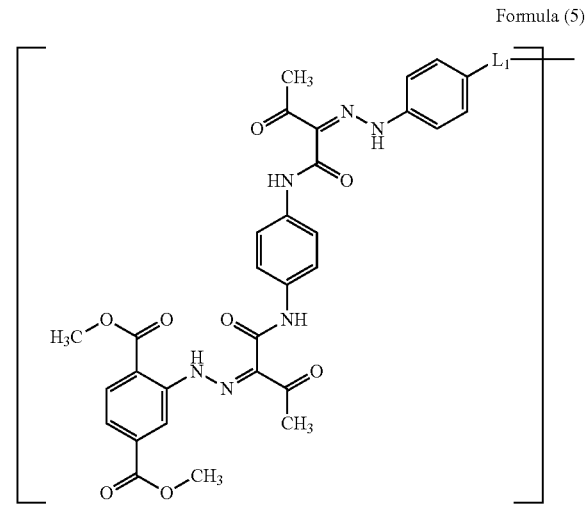

Formula (5)

[wherein $L_1$ represents a divalent linking group].

Next, the polymer resin unit according to the present invention having at least one of a monomer unit represented by formula (3) and a monomer unit represented by formula (4) will be described.

Examples of the alkyl group in $R_{15}$ in formula (3) include a methyl group and an ethyl group.

$R_{15}$ in formula (3) can be arbitrarily selected from the alkyl groups and a hydrogen atom. From the viewpoint of ease of production, a hydrogen atom or a methyl group is preferred.

Examples of the alkyl group in $R_{16}$ in formula (4) include a methyl group and an ethyl group.

$R_{16}$ in formula (4) can be arbitrarily selected from the alkyl groups and a hydrogen atom. From the viewpoint of ease of production, a hydrogen atom or a methyl group is preferred.

Examples of the alkyl group in $R_{17}$ in formula (4) include linear, branched, or cyclic alkyl groups such as a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-behenyl group, an isopropyl group, an isobutyl group, a sec-butyl group, a tert-butyl group, a 2-ethylhexyl group, and a cyclohexyl group.

Examples of the aralkyl group in $R_{17}$ in formula (4) include a benzyl group and a phenethyl group.

$R_{17}$ in formula (4) can be arbitrarily selected from the substituents listed above. From the viewpoint of the affinity with the water-insoluble solvent, those having 4 or more carbon atoms are preferred.

The polymer resin unit in the present invention can control affinity with a dispersion medium by changing the proportion of the monomer unit represented by formula (3) or (4). In the case where the dispersion medium is a nonpolar solvent such as styrene, a larger proportion of the monomer unit represented by formula (3) is preferred from the viewpoint of affinity with a dispersion medium. In the case where the dispersion medium is a solvent having polarity to some extent such as acrylic acid ester, a larger proportion of the monomer unit represented by formula (3) is preferred from the viewpoint of the affinity with a dispersion medium.

In the molecular weight of the polymer resin unit in the present invention, the number average molecular weight is preferably not less than 500 from the viewpoint of improvement in the dispersibility of the pigment. A larger molecular weight provides a higher effect of improving the dispersibility of the pigment. If the molecular weight is excessively large, however, the affinity with the water-insoluble solvent is inferior. Accordingly, such an excessively large molecular weight is not preferred. Accordingly, the number average molecular weight of the polymer resin unit is preferably not more than 200000. Besides, considering ease of production, the number average molecular weight of the polymer resin unit is more preferably within the range of 2000 to 50000.

As disclosed in National Publication of International Patent Application No. 2003-531001, a method is known in which a branched aliphatic chain is introduced into the terminal in a polyoxyalkylenecarbonyl dispersant to improve dispersibility. In the polymer resin unit according to the present invention, a branched aliphatic chain can be introduced into the terminal and the dispersibility may be improved if a telechelic polymer resin unit is synthesized by a method such as ATRP (Atom Transfer Radial Polymerization) as described later.

In the compound having the bisazo skeleton unit according to the present invention, the bisazo skeleton unit may be scattered at random. Preferably, one or a plurality of blocks are formed at one end and localized because the effect of improving the dispersibility is higher.

In the compound having the bisazo skeleton unit according to the present invention, the affinity with the pigment is higher as the number of the bisazo skeleton unit is larger. The excessively large number of the bisazo skeleton unit, however, reduces the affinity with the water-insoluble solvent and is not preferred. Accordingly, the number of the bisazo skeleton unit is preferably within the range of 1 to 10, and more preferably 1 to 5 based on 100 monomers that form the polymer resin unit.

As illustrated in the drawing below, the bisazo skeleton unit represented by formula (1) has tautomers represented by formulas (7) and (8). These tautomers are included within the scope of the present invention.

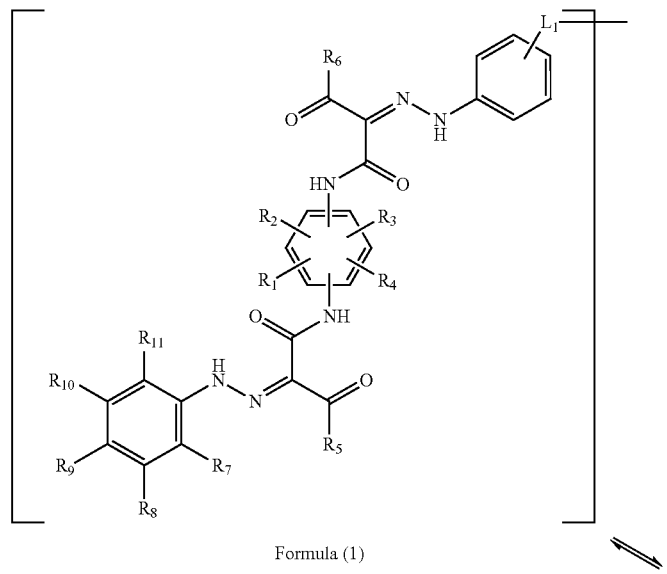

Formula (1)

-continued
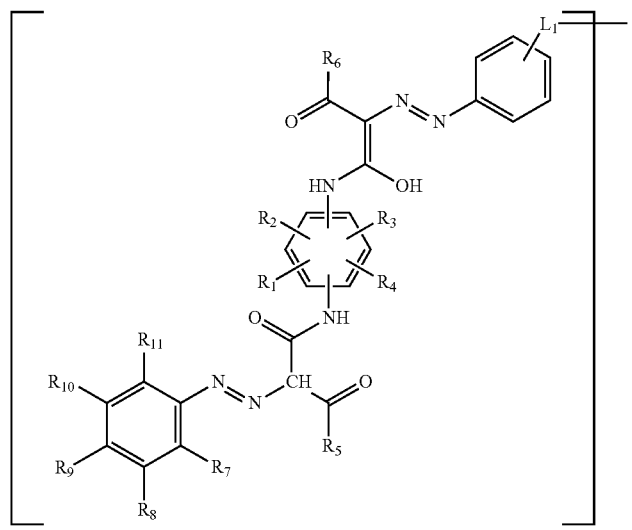
Formula (7)
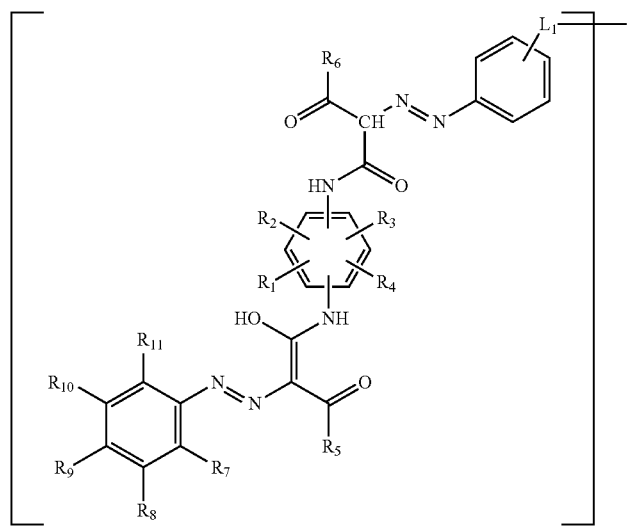
Formula (8)

[wherein $R_1$ to $R_{11}$ and $L_1$ each are the same as those in formula (1).]
As illustrated in the drawing below, the bisazo skeleton unit represented by formula (2) has tautomers represented by formulas (9) and (10). These tautomers are also included within the scope of the present invention.
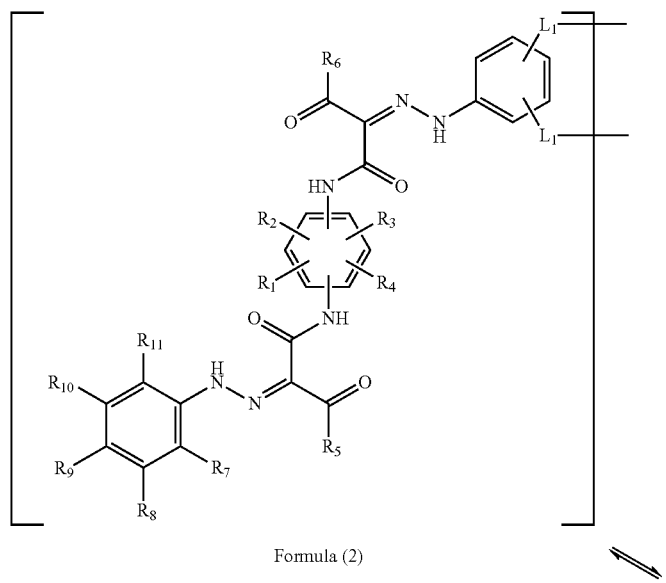
Formula (2)
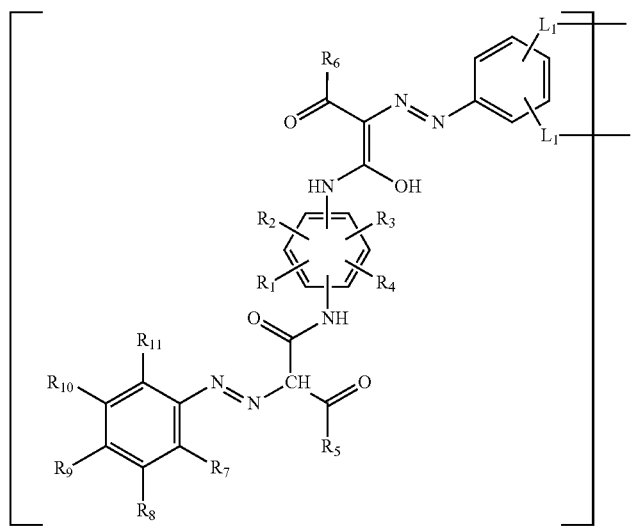
Formula (9)

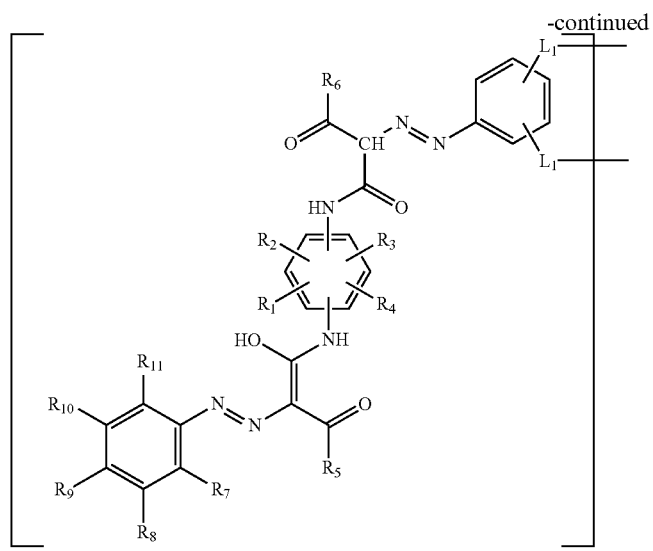
Formula (10)
[wherein $R_1$ to $R_{11}$ and $L_1$ each are the same as those in formula (2).]
The bisazo skeleton unit according to the present invention represented by formula (1) or formula (2) can be synthesized according to a known method. An example of a synthesis scheme of synthesizing a bisazo compound intermediate product (20) will be shown below.
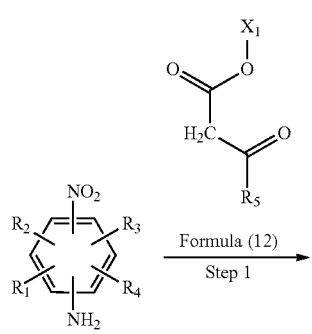
Formula (11)
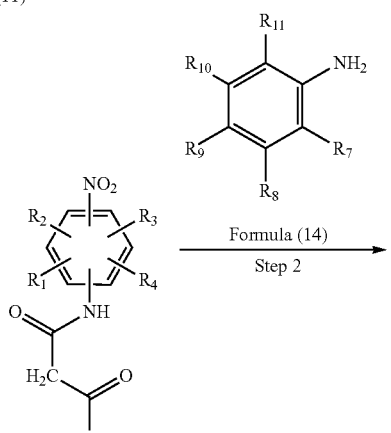
Formula (13)
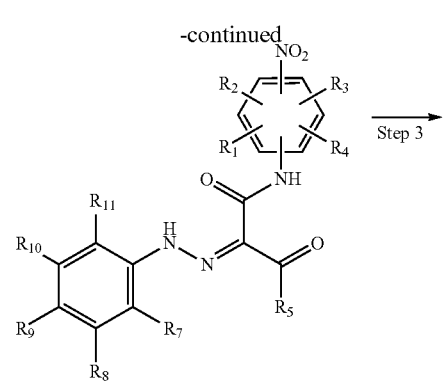
Formula (15)
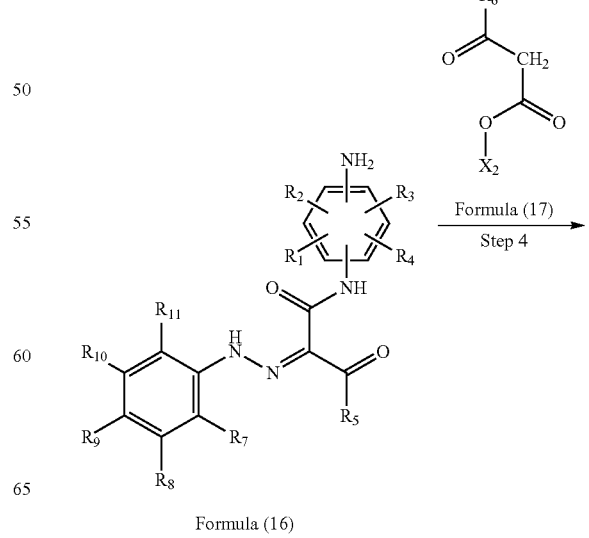
Formula (16)

-continued

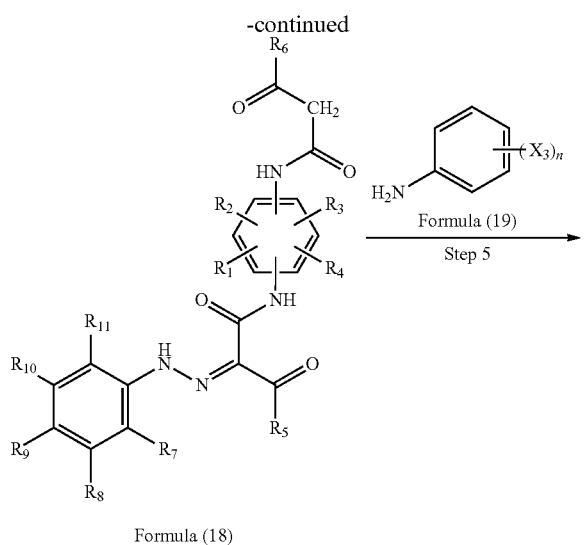

Formula (18)

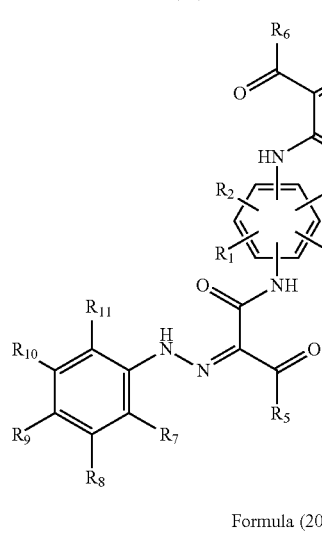

Formula (20)

[wherein $R_1$ to $R_{11}$ are the same as those in formula (1) or formula (2); $X_1$ in formula (12) and $X_2$ in formula (17) represent a leaving group; $X_3$ in formulas (19) and (20) represents a substituent that reacts to form the linking group $L_1$ in formula (1) or (2); n represents an integer value of 1 or 2.]

In the scheme exemplified above, a bisazo compound intermediate product (20) is synthesized by Step 1 of amidizing a nitroaniline derivative represented by formula (11) and an acetoacetic acid analog represented by formula (1) to synthesize an intermediate product (13) as an acetoacetanilide analog, Step 2 of diazo coupling the intermediate product (13) to an aniline derivative (14) to synthesize an azo compound (15), Step 3 of reducing a nitro group in the azo compound (15) to synthesize an intermediate product (16) as an aniline analog, Step 4 of amidizing the intermediate product (16) and an acetoacetic acid analog represented by formula (17) to synthesize an intermediate product (18) as an acetoacetanilide analog, and Step 5 of diazo coupling the intermediate product (18) to an aniline derivative (19).

First, Step 1 will be described. In Step 1, a known method can be used [for example, Datta E. Ponde et al., "The Journal of Organic Chemistry," (the United States), American Chemical Society, 1998, Vol. 63, No. 4, pp. 1058-1063]. In the case where $R_5$ in formula (13) is a methyl group, synthesis is allowed by a method using diketene instead of the raw material (12) [for example, Kiran Kumar Solingapuram Sai et al., "The Journal of Organic Chemistry," (the United States), American Chemical Society, 2007, Vol. 72, No. 25, pp. 9761-9764].

A variety of the nitroaniline derivatives (11) and the acetoacetic acid analogs (12) are commercially available, and easily available. The nitroaniline derivative (11) and the acetoacetic acid analog (12) can also be synthesized by a known method easily.

The step can be performed without a solvent. In order to prevent rapid progress of the reaction, preferably, the step is performed in the presence of a solvent. The solvent is not particularly limited unless the solvent inhibits the reaction, and examples thereof include alcohols such as methanol, ethanol, and propanol; esters such as methyl acetate, ethyl acetate, and propyl acetate; ethers such as diethyl ether, tetrahydrofuran, and dioxane; hydrocarbons such as benzene, toluene, xylene, hexane, and heptane; halogen-containing hydrocarbons such as dichloromethane, dichloroethane, and chloroform; amides such as N,N-dimethylformamide, N-methylpyrrolidone, and N,N-dimethylimidazolidinone; nitriles such as acetonitrile and propionitrile; acids such as formic acid, acetic acid, and propionic acid; and water. Two or more of the solvents can be used in combination, and the mixing ratio in use by mixing can be arbitrarily determined according to the solubility of a solute. The amount of the solvent to be used can be arbitrarily determined, and is preferably in the range of 1.0 to 20 times by mass based on the compound represented by formula (11) from the viewpoint of the reaction rate.

The step is performed usually at a temperature in the range of 0° C. to 250° C., and completed usually within 24 hours.

Next, Step 2 will be described. In Step 2, a known method can be used. Specifically, examples thereof include a method described below. First, in a methanol solvent, the aniline derivative (14) is reacted with a diazotization agent such as sodium nitrite or nitrosylsulfuric acid in the presence of an inorganic acid such as hydrochloric acid or sulfuric acid to synthesize a corresponding diazonium salt. Further, the diazonium salt is coupled to the intermediate product (13) to synthesize the azo compound (15).

A variety of the aniline derivatives (14) are commercially available, and easily available. The aniline derivative (14) can also be synthesized by a known method easily.

The step can be performed without a solvent. In order to prevent rapid progress of the reaction, preferably, the step is performed in the presence of a solvent. The solvent is not particularly limited unless the solvent inhibits the reaction, and examples thereof include alcohols such as methanol, ethanol, and propanol; esters such as methyl acetate, ethyl acetate, and propyl acetate; ethers such as diethyl ether, tetrahydrofuran, and dioxane; hydrocarbons such as benzene, toluene, xylene, hexane, and heptane; halogen-containing hydrocarbons such as dichloromethane, dichloroethane, and chloroform; amides such as N,N-dimethylformamide, N-methylpyrrolidone, and N,N-dimethylimidazolidinone; nitriles such as acetonitrile and propionitrile; acids such as formic acid, acetic acid, and propionic acid; and water. Two or more of the solvents can be used in combination, and the mixing ratio in use by mixing can be arbitrarily determined according to the solubility of a solute. The amount of the solvent to be used can be arbitrarily determined, and is preferably in the range of 1.0 to 20 times by mass based on the compound represented by formula (14) from the viewpoint of the reaction rate.

The step is performed usually at a temperature in the range of −50° C. to 100° C., and completed usually within 24 hours.

Next, Step 3 will be described. In Step 3, a known method can be used [examples of a method using a metal compound or the like include "Jikken Kagaku Koza," Maruzen Company, Limited, the second edition, Vol. 17-2, pp. 162-179; and examples of a contact hydrogenation method include "Shin Jikken Kagaku Koza," Maruzen Company, Limited, the first edition, Vol. 15, pp. 390-448, or WO 2009-060886].

The step can be performed without a solvent. In order to prevent rapid progress of the reaction, preferably, the step is performed in the presence of a solvent. The solvent is not particularly limited unless the solvent inhibits the reaction, and examples thereof include alcohols such as methanol, ethanol, and propanol; esters such as methyl acetate, ethyl acetate, and propyl acetate; ethers such as diethyl ether, tetrahydrofuran, and dioxane; hydrocarbons such as benzene, toluene, xylene, hexane, heptane; amides such as N,N-dimethylformamide, N-methylpyrrolidone, and N,N-dimethylimidazolidinone. Two or more of the solvents can be used in combination, and the mixing ratio in use by mixing can be arbitrarily determined. The amount of the solvent to be used can be arbitrarily determined according to the solubility of a solute, and is preferably in the range of 1.0 to 20 times by mass based on compound represented by formula (15) from the viewpoint of the reaction rate.

The step is performed usually at a temperature in the range of 0° C. to 250° C., and completed usually within 24 hours.

Next, Step 4 will be described. In Step 4, the intermediate product (18) as the acetoacetanilide analog can be synthesized using the same method as that in Step 1.

Next, Step 5 will be described. In Step 5, the bisazo compound intermediate product (20) can be synthesized using the same method as that in Step 2.

A variety of the nitroaniline derivatives (19) are commercially available, and easily available. The nitroaniline derivative (19) can also be synthesized by a known method easily.

Examples of a method of synthesizing the compound having bisazo skeleton unit represented by formula (1) or (2) from the obtained bisazo compound intermediate product (20) include methods (i) to (iii) described below.

First, the method (i) will be specifically described by describing the scheme below.

Method (i)

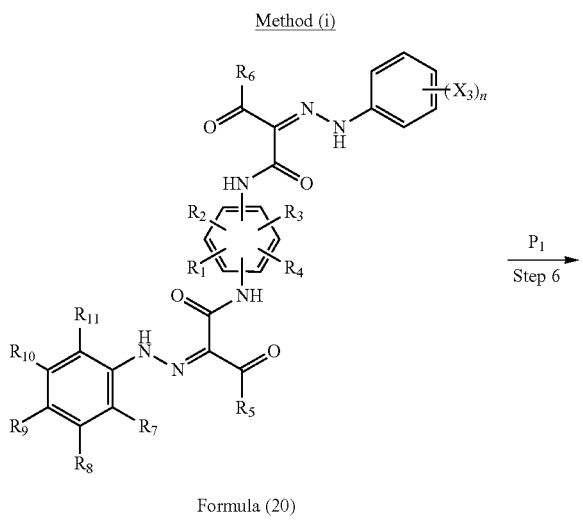

Formula (20)

Compound having bisazo compound skeleton unit represented by Formula (1) or (2)

[wherein $R_1$ to $R_{11}$, $X_3$, and n are the same as those in formula (20) in the synthesis scheme of synthesizing the bisazo compound intermediate product (20); $P_1$ represents a polymer resin unit having at least one of a monomer unit represented by formula (3) and a monomer unit represented by formula (4)].

First, a method for synthesizing the polymer resin unit $P_1$ used in Step 6 will be described. The polymer resin unit $P_1$ can be synthesized using a known polymerization method [examples thereof include Krzysztof Matyjaszewski et al., "Chemical Reviews," (the United States), American Chemical Society, 2001, Vol. 101, pp. 2921-2990].

Specifically, examples thereof include radical polymerization, cationic polymerization, anionic polymerization, and use of the radical polymerization is preferred from the viewpoint of ease of production.

The radical polymerization can be performed by use of a radical polymerization initiator, irradiation with radiation or laser light, use of a photopolymerization initiator in combination with irradiation with light, heating, or the like.

Any radical polymerization initiator can be used as long as the radical polymerization initiator can generate radicals to initiate the polymerization reaction. The radical polymerization initiator can be selected from a compound that generates radicals by action of heat, light, radiation, an oxidation and reduction reaction, or the like. Examples thereof include azo compounds, organic peroxides, inorganic peroxides, organic metal compounds, and photopolymerization initiators. More specifically, examples thereof include azo polymerization initiators such as 2,2'-azobis(isobutyronitrile), 2,2'-azobis(2-methylbutyronitrile), 2,2'-azobis(4-methoxy-2,4-dimethylvaleronitrile), 2,2'-azobis(2,4-dimethylvaleronitrile); organic peroxide polymerization initiators such as benzoyl peroxide, di-tert-butyl peroxide, tert-butylperoxyisopropyl carbonate, tert-hexyl peroxybenzoate, and tert-butyl peroxybenzoate; inorganic peroxide polymerization initiators such as potassium persulfate and ammonium persulfate; and redox initiators such as ferrous hydrogen peroxide redox initiators, benzoyl peroxide-dimethylaniline redox initiators, cerium (IV) salt-alcohol redox initiators. Examples of the photopolymerization initiators include benzophenone photopolymerization initiators, benzoin photopolymerization initiators, acetophenone photopolymerization initiators, and thioxanthone photopolymerization initiators. Two or more of these radical polymerization initiators may be used in combination.

The amount of the polymerization initiator to be used is preferably controlled in the range of 0.1 to 20 parts by mass based on 100 parts by mass of the monomer so as to obtain a copolymer having target molecular weight distribution.

The polymer resin unit represented by $P_1$ can be produced by using any method of solution polymerization, suspension polymerization, emulsion polymerization, dispersion polymerization, precipitation polymerization, and bulk polymerization, and the method is not particularly limited. Preferred is the solution polymerization in a solvent in which the components used in production can be dissolved. Specifically, examples of the solvent include alcohols such as methanol, ethanol, and 2-propanol; ketones such as acetone and methyl ethyl ketone; ethers such as tetrahydrofuran and diethyl ether; ethylene glycol monoalkyl ethers or acetates thereof; propylene glycol monoalkyl ethers or acetates thereof; polar organic solvents such as diethylene glycol monoalkyl ethers; and nonpolar solvents such as toluene and xylene depending on cases, and these can be used singly or mixed and used. Among these, the solvents having a boiling point in the range of 100 to 180° C. are more preferably used singly or mixed and used.

The suitable range of the polymerization temperature depends on the kind of the radical polymerization reaction. Specifically, usually, the polymerization is performed at a temperature in the range of −30 to 200° C., and a more preferred temperature range is 40 to 180° C.

The molecular weight distribution and molecular structure of the polymer resin unit represented by $P_1$ can be controlled using a known method. Specifically, the polymer resin unit having controlled molecular weight distribution and molecular structure can be produced, for example, using a method using an addition-fragmentation chain transfer agent (see Japanese Patent Nos. 4254292 and 03721617), an NMP method using dissociation and bond of amine oxide radicals [such as Craig J. Hawker et al., "Chemical Reviews," (the United States), American Chemical Society, 2001, Vol. 101, pp. 3661-3688], an ATRP method in which polymerization is performed using a halogen compound as a polymerization initiator, a heavy metal, and a ligand [such as Masami Kamigaito et al., "Chemical Reviews," (the United States), American Chemical Society, 2001, Vol. 101, pp. 3689-3746], a RAFT method using dithiocarboxylic acid ester or a xanthate compound as a polymerization initiator (such as National Publication of International Patent Application No. 2000-515181), and an MADIX method (such as WO 99/05099), and a DT method [such as Atsushi Goto et al., "Journal of The American Chemical Society," (the United States), American Chemical Society, 2003, Vol. 125, pp. 8720-8721].

Next, Step 6 will be described. In Step 6, a known method can be used. Specifically, for example, by using the polymer resin unit $P_1$ having a carboxyl group and the bisazo compounds (20) in which $X_3$ is a substituent having a hydroxyl group, the compound having bisazo skeleton unit represented by formula (1) or (2) can be synthesized in which the linking group $L_1$ has a carboxylic acid ester bond. Alternatively, by using the polymer resin unit $P_1$ having a hydroxyl group and a raw material in which $X_3$ in formula (20) is a substituent having a sulfonic acid group, the compound having bisazo skeleton unit represented by formula (1) or (2) can be synthesized in which the linking group $L_1$ has a sulfonic acid ester bond. Further, by using the polymer resin unit $P_1$ having a carboxyl group and a raw material in which $X_3$ in formula (20) is a substituent having an amino group, the compound having bisazo skeleton unit represented by formula (1) or (2) can be synthesized in which the linking group $L_1$ has a carboxylic acid amide bond. Specifically, examples of the known method include a method using a dehydration condensing agent such as 1-ethyl-3-(3-dimethylaminopropyl)carbodiimidehydrochloric acid salt or the like (such as John Sheehan et al., "The Journal of Organic Chemistry", (the United States), American Chemical Society, 1961, Vol. 26, No. 7, pp. 2525-2528); and a Schotten-Baumann method (such as Norman O. V. Sonntag, "Chemical Reviews," (the United States), American Chemical Society, 1953, Vol. 52, No. 2, pp. 237-416).

The step can be performed without a solvent. In order to prevent rapid progress of the reaction, preferably, the step is performed in the presence of a solvent. The solvent is not particularly limited unless the solvent inhibits the reaction, and examples thereof include ethers such as diethyl ether, tetrahydrofuran, and dioxane; hydrocarbons such as benzene, toluene, xylene, hexane, and heptane; halogen-containing hydrocarbons such as dichloromethane, dichloroethane, and chloroform; amides such as N,N-dimethylformamide, N-methylpyrrolidone, and N,N-dimethylimidazolidinone; and nitriles such as acetonitrile and propionitrile. Two or more of the solvents can be used by mixing, and the mixing ratio in use by mixing can be arbitrarily determined according to the solubility of a solute. The amount of the solvent to be used can be arbitrarily determined. From the viewpoint of the reaction rate, the amount is preferably in the range of 1.0 to 20 times by mass based on the compound represented by formula (20).

The step is performed usually at a temperature in the range of 0° C. to 250° C., and completed usually within 24 hours.

Next, the method (ii) will be specifically described by describing the scheme below.

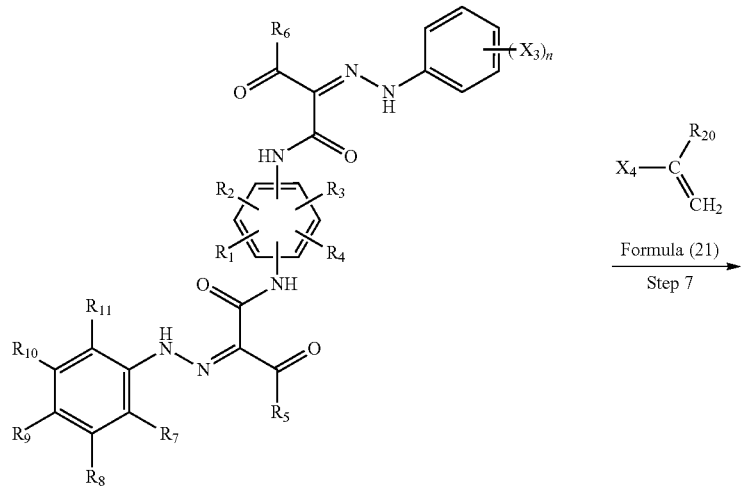

Method (ii)

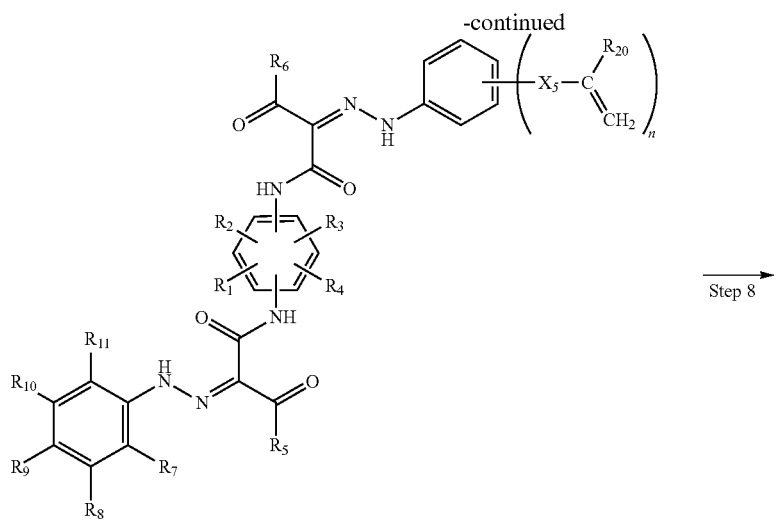

Formula (22)

[wherein $R_1$ to $R_{11}$, $X_3$, and n in formula (20) are the same as those in formula (20) in the synthesis scheme of synthesizing the bisazo compound intermediate product (20); $R_{20}$ in formula (21) represents a hydrogen atom or an alkyl group, and $X_4$ represents a substituent that reacts with $X_3$ in formula (20) to form $X_5$ in formula (22). $R_1$ to $R_{11}$, $R_{20}$, and n in formula (22) are the same as those in formulas (20) and (21), and $X_5$ represents a linking group formed by reacting $X_3$ in formula (20) with $X_4$ in formula (21)].

In the scheme exemplified above, the compound having the bisazo compound skeleton unit represented by formula (1) or (2) is synthesized by Step 7 of introducing the vinyl group-containing compound represented by formula (21) into the bisazo compound intermediate product represented by formula (20) to synthesize the polymerizable monomer (22) having the bisazo compound skeleton, and Step 8 of copolymerizing the polymerizable monomer (22) having the bisazo compound skeleton with the polymerizable monomer(s) represented by formula (3) and/or formula (4).

First, Step 7 will be described. In Step 7, the polymerizable monomer (22) having the bisazo compound skeleton can be synthesized using the same method as that in Step 6 in the method (i).

A variety of the vinyl group-containing compounds (21) are commercially available, and easily available. The vinyl group-containing compound (21) can also be synthesized by a known method easily.

Next, Step 8 will be described. In Step 8, the compound having bisazo skeleton unit represented by formula (1) or (2) can be synthesized using the same method as that in synthesis of the polymer resin unit $P_1$ in the method (i).

Next, the method (iii) will be specifically described by describing the scheme below.

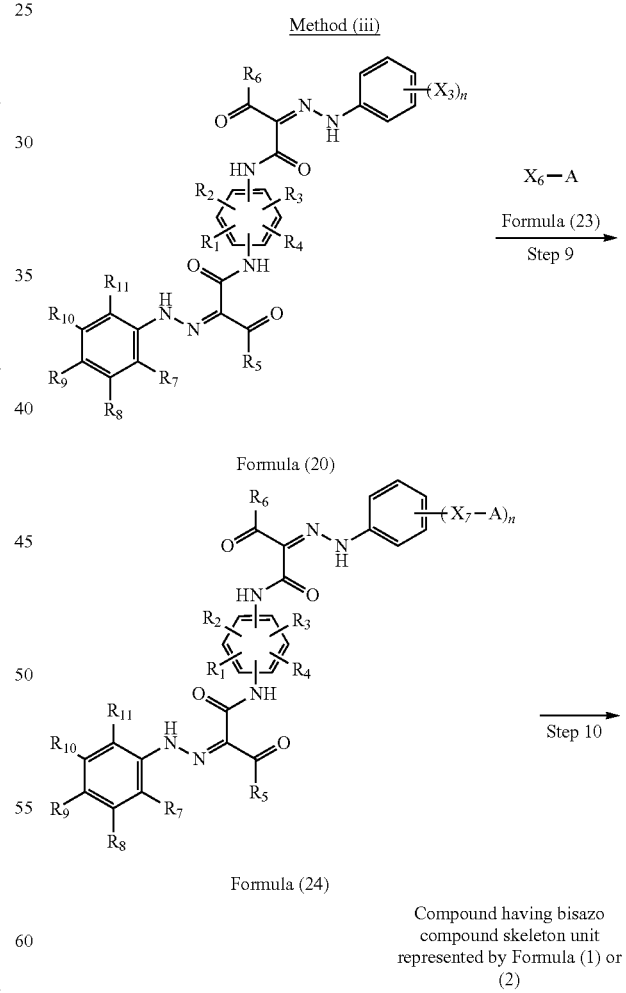

Compound having bisazo compound skeleton unit represented by Formula (1) or (2)

[wherein $R_1$ to $R_{11}$, $X_3$, and n in formula (20) are the same as those in formula (20) in the synthesis scheme of synthesizing the bisazo compound intermediate product (20); $X_6$ in formula (23) represents a substituent that reacts with $X_3$ in formula (20) to form X$_7$ in formula (24), and A represents a chlorine atom, a bromine atom, or an iodine atom; R$_1$ to R$_{11}$ and A in formula (24) are the same as those in formula (20), n is the same as that in formula (23), and X$_7$ represents a linking group formed by reacting X$_3$ in formula (20) with X$_6$ in formula (23)].

In the scheme exemplified above, the compound having the bisazo compound skeleton unit represented by formula (1) or (2) is synthesized by Step 9 of introducing the halogen atom-containing compound represented by formula (23) into the bisazo compound intermediate product represented by formula (20) to synthesize the bisazo compound intermediate product (24) having a halogen atom, and Step 10 of polymerizing a polymerizable monomer using the bisazo compound intermediate product (24) having a halogen atom as the polymerization initiator.

First, Step 9 will be described. In Step 9, the bisazo compound intermediate product (24) having a halogen atom can be synthesized using the same method as that in Step 6 in the method (i). Specifically, for example, by using the halogen atom-containing compound (23) having a carboxyl group and the bisazo compounds (20) in which X$_3$ is a substituent having a hydroxyl group, the compound having bisazo skeleton unit represented by formula (1) or (2) can be finally synthesized in which the linking group L$_1$ has a carboxylic acid ester bond. Alternatively, by using the halogen atom-containing compound (23) having a hydroxyl group and a raw material in which X$_3$ in formula (20) is a substituent having a sulfonic acid group, the compound having bisazo skeleton unit represented by formula (1) or (2) can be finally synthesized in which the linking group L$_1$ has a sulfonic acid ester bond. Further, halogen atom-containing compound (23) having a carboxyl group and a raw material in which X$_3$ in formula (20) is a substituent having an amino group, the compound having bisazo skeleton unit represented by formula (1) or (2) can be finally synthesized in which the linking group L$_1$ has a carboxylic acid amide bond.

Examples of the halogen atom-containing compound (23) having a carboxyl group include chloroacetic acid, α-chloropropionic acid, α-chlorobutyric acid, α-chloroisobutyric acid, α-chlorovaleric acid, α-chloroisovaleric acid, α-chlorocaproic acid, α-chlorophenylacetic acid, α-chlorodiphenylacetic acid, α-chloro-α-phenylpropionic acid, α-chloro-β-phenylpropionic acid, bromoacetic acid, α-bromopropionic acid, α-bromobutyric acid, α-bromoisobutyric acid, α-bromovaleric acid, α-bromoisovaleric acid, α-bromocaproic acid, α-bromophenylacetic acid, α-bromodiphenylacetic acid, α-bromo-α-phenylpropionic acid, α-bromo-β-phenylpropionic acid, iodoacetic acid, α-iodopropionic acid, α-iodobutyric acid, α-iodoisobutyric acid, α-iodovaleric acid, α-iodoisovaleric acid, α-iodocaproic acid, α-iodophenylacetic acid, α-iododiphenylacetic acid, α-iodo-α-phenylpropionic acid, α-iodo-β-phenylpropionic acid, β-chlorobutyric acid, β-bromoisobutyric acid, iododimethylmethylbenzoic acid, and 1-chloroethylbenzoic acid. Halides and acid anhydrides thereof can also be used in the present invention.

Examples of the halogen atom-containing compound (23) having a hydroxyl group include 1-chloroethanol, 1-bromoethano, 1-iodoethanol, 1-chloropropanol, 2-bromopropanol, 2-chloro-2-propanol, 2-bromo-2-methylpropanol, 2-phenyl-1-bromoethanol, and 2-phenyl-2-iodoethanol.

Next, Step 10 will be described. In Step 10, the compound having bisazo skeleton unit represented by formula (1) or (2) can be synthesized by using the ATRP in the method (i) and polymerizing the polymerizable monomer(s) represented by formula (s) (3) and/or (4) using the bisazo compound intermediate product (24) having a halogen atom as the polymerization initiator.

The compounds represented by formulas (1), (2), (13), (15), (16), (18), (20), (22), and (24) and obtained in the respective steps can be subjected to an isolation and refining method for an organic compound usually used. Examples of the isolation and refining method include recrystallization and reprecipitation using an organic solvent, and column chromatography using silica gel. These methods can be used singly or in combinations of two or more to perform refining. Thereby, the compound with high purity can be obtained.

The compounds represented by formulas (13), (15), (16), (18), (20), (22), and (24) and obtained in the respective steps were identified and determined by a nuclear magnetic resonance spectroscopy [ECA-400, made by JEOL, Ltd.], an ESI-TOF MS (LC/MSD TOF, made by Agilent Technologies, Inc.), and HPLC analysis [LC-20A, made by SHIMADZU Corporation].

The compounds represented by formulas (1) and (2) and obtained in the respective steps were identified and determined by a high-speed GPC [HLC8220GPC, made by Tosoh Corporation], a nuclear magnetic resonance spectroscopy [ECA-400, made by JEOL, Ltd.], and acid value measurement according to JIS K-0070 [Automatic Titrator COM-2500, made by Hiranuma Sangyo Co., Ltd.].

Next, the pigment dispersant and pigment composition according to the present invention will be described. The compound having a bisazo skeleton unit represented by formula (1) or (2) according to the present invention has high affinity with an azo pigment, particularly an acetoacetanilide pigment, and high affinity with a water-insoluble solvent. Accordingly, the compounds can be used singly or in combinations of two or more as the pigment dispersant.

The pigment composition according to the present invention is used for coating materials, inks, resin molded products, and the like, and contains at least one compound having a bisazo skeleton unit represented by formula (1) or formula (2) according to the present invention as the pigment dispersant.

Examples of the pigment usable in the present invention include monoazo pigments, bisazo pigments, or polyazo pigments. Among these, acetoacetanilide pigments such as C.I. Pigment Yellow 74, C.I. Pigment Yellow 93, C.I. Pigment Yellow 128, C.I. Pigment Yellow 155, C.I. Pigment Yellow 175, and C.I. Pigment Yellow 180 are preferred because these have higher affinity with the pigment dispersant according to the present invention. Particularly, C.I. Pigment Yellow 155 represented by formula (6) is more preferred because of a high dispersing effect provided by the compound having a bisazo skeleton unit according to the present invention. The pigments above may be used singly or in mixtures of two or more.

Formula (6)

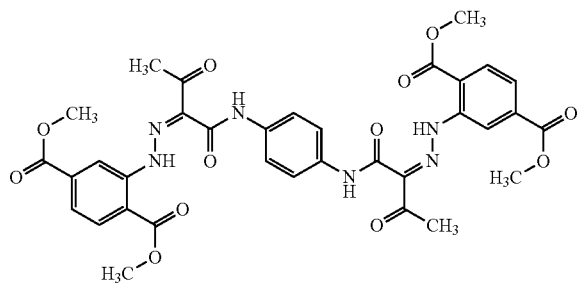

A pigment other than the yellow pigments above can be suitably used as the pigment usable in the present invention as long as the pigment has affinity with the pigment dispersant according to the present invention, and is not limited.

Examples thereof include azo pigments such as C.I. Pigment Orange 1, C.I. Pigment Orange 5, C.I. Pigment Orange 13, C.I. Pigment Orange 15, C.I. Pigment Orange 16, C.I. Pigment Orange 34, C.I. Pigment Orange 36, C.I. Pigment Orange 38, C.I. Pigment Orange 62, C.I. Pigment Orange 64, C.I. Pigment Orange 67, C.I. Pigment Orange 72, C.I. Pigment Orange 74, C.I. Pigment Red 2, C.I. Pigment Red 3, C.I. Pigment Red 4, C.I. Pigment Red 5, C.I. Pigment Red 12, C.I. Pigment Red 16, C.I. Pigment Red 17, C.I. Pigment Red 23, C.I. Pigment Red 31, C.I. Pigment Red 32, C.I. Pigment Red 41, C.I. Pigment Red 17, C.I. Pigment Red 48, C.I. Pigment Red 48:1, C.I. Pigment Red 48:2, C.I. Pigment Red 53:1, C.I. Pigment Red 57:1, C.I. Pigment Red 112, C.I. Pigment Red 144, C.I. Pigment Red 146, C.I. Pigment Red 166, C.I. Pigment Red 170, C.I. Pigment Red 176, C.I. Pigment Red 185, C.I. Pigment Red 187, C.I. Pigment Red 208, C.I. Pigment Red 210, C.I. Pigment Red 220, C.I. Pigment Red 221, C.I. Pigment Red 238, C.I. Pigment Red 242, C.I. Pigment Red 245, C.I. Pigment Red 253, C.I. Pigment Red 258, C.I. Pigment Red 266, C.I. Pigment Red 269, C.I. Pigment Violet 13, C.I. Pigment Violet 25, C.I. Pigment Violet 32, C.I. Pigment Violet 50, C.I. Pigment Blue 25, C.I. Pigment Blue 26, C.I. Pigment Brown 23, C.I. Pigment Brown 25, and C.I. Pigment Brown 41.

These may be a crude pigment, or may be a prepared pigment composition unless these pigments remarkably inhibit the effect of the pigment dispersant according to the present invention.

In the pigment composition according to the present invention, the mass composition ratio of the pigment to the pigment dispersant is preferably in the range of 100:1 to 100:100. More preferably, the ratio is in the range of 100:5 to 100:50 from the viewpoint of the dispersibility of the pigment.

The pigment composition according to the present invention can be produced by a wet method or a dry method. Considering that the compound having a bisazo skeleton unit according to the present invention has high affinity with the water-insoluble solvent, the pigment composition is preferably produced by the wet method that can produce a uniform pigment composition simply. Specifically, the pigment composition can be obtained as follows, for example. The pigment dispersant, and when necessary a resin are dissolved in a disperse medium. While the disperse medium is stirred, a pigment powder is gradually added and sufficiently mixed with the disperse medium. Further, a mechanical shear force is applied by a dispersing machine such as a kneader, a roll mill, a ball mill, a paint shaker, a dissolver, an Attritor, a sand mill, and a high speed mill. Thereby, the pigment can be stably finely dispersed in a state of a uniform fine particle.

The disperse medium usable for the pigment composition according to the present invention is determined according to the purpose and application of the pigment composition, and not particularly limited. A preferred disperse medium is a water-insoluble solvent in order to obtain the high pigment dispersing effect of the compound having a bisazo skeleton unit represented by formula (1) or (2) according to the present invention. Here, the water-insoluble solvent refers to solvents not soluble in water or solvents in which the amount of the solvent soluble in water at 25° C. is not more than 30% by mass based on the mass of water. Examples of the water-insoluble solvent specifically include esters such as methyl acetate, ethyl acetate, and propyl acetate; hydrocarbons such as hexane, octane, isooctane, decane, isodecane, decalin, nonane, dodecane, isododecane, petroleum ether, cyclohexane, benzene, toluene, xylene, mineral spirits, Isopar E, Isopar G, Isopar H, Isopar L, Isopar M, and Isopar V made by Exxon Mobil Corporation, and ShellSol A100 and ShellSol A150 made by Shell Chemicals Japan Ltd.; halogen-containing hydrocarbons such as chloroform, carbon tetrachloride, dichloroethane, trichloroethylene, and tetrabromoethane; ketones such as methyl ethyl ketone, methyl isobutyl ketone, methyl-n-amylketone, and cyclohexanone; and glycol ether esters such as ethylene glycol monobutyl ether acetate, 3-methoxybutyl acetate, diethylene glycol monobutyl ether acetate, and propylene glycol monomethyl ether acetate.

The disperse medium usable for the pigment composition according to the present invention may be a polymerizable monomer. Specifically, examples of the polymerizable monomer can include styrene, α-methylstyrene, α-ethylstyrene, o-methylstyrene, m-methylstyrene, p-methylstyrene, p-methoxystyrene, p-phenylstyrene, p-chlorostyrene, 3,4-dichlorostyrene, p-ethylstyrene, 2,4-dimethylstyrene, p-n-butylstyrene, p-tert-butylstyrene, p-n-hexylstyrene, p-n-octylstyrene, p-n-nonylstyrene, p-n-decylstyrene, p-n-dodecylstyrene, ethylene, propylene, butylene, isobutylene, vinyl chloride, vinylidene chloride, vinyl bromide, vinyl iodide, vinyl acetate, vinyl propionate, vinyl benzoate, methyl methacrylate, ethyl methacrylate, propyl methacrylate, butyl methacrylate, n-octyl methacrylate, dodecyl methacrylate, 2-ethylhexyl-methacrylate, stearyl methacrylate, behenyl methacrylate, phenyl methacrylate, dimethylaminoethyl methacrylate, diethylaminoethyl methacrylate, methyl acrylate, ethyl acrylate, n-butyl acrylate, isobutyl acrylate, propyl acrylate, n-octyl acrylate, dodecyl acrylate, 2-ethylhexyl acrylate, stearyl acrylate, behenyl acrylate, 2-chloroethyl acrylate, phenyl acrylate, vinyl methyl ether, vinyl ethyl ether, vinyl isobutyl ether, vinyl methyl ketone, vinyl hexyl ketone, methyl isopropenyl ketone, vinylnaphthalene, acrylonitrile, methacrylonitrile, and acrylamide.

The resin usable for the pigment composition according to the present invention is determined according to the purpose and application of the pigment composition, and not particularly limited. Specifically, examples thereof include polystyrene resins, styrene copolymers, polyacrylic acid resins, polymethacrylic acid resins, polyacrylic acid ester resins, polymethacrylic ester resins, acrylic acid ester copolymers, methacrylic acid ester copolymers, polyester resins, polyvinyl ether resins, polyvinyl alcohol resins, and polyvinyl butyral resins. Other examples of the resin include polyurethane resins and polypeptide resins. Two or more of these disperse media can be mixed and used. The pigment composition produced by the method according to the present invention can be isolated by a known method such as filtration, decantation, or centrifugation. The solvent can also be removed by washing.

An aid may be further added to the pigment composition according to the present invention during production. Specifically, examples of the aid include a surfactant, pigment and non-pigment dispersants, a filler, a standardizer, a resin, a wax, an antifoaming agent, an antistatic agent, an anti-dust agent, an extender, a shading colorant, a preservant, a drying inhibitor, a rheology control additive, a wetting agent, an antioxidant, a UV absorber, a light stabilizer, or a combination thereof. The pigment dispersant according to the present invention may be added in advance when a crude pigment is produced.

Next, the pigment dispersion according to the present invention will be described. The pigment dispersion according to the present invention includes the pigment composition above and the water-insoluble solvent. The pigment composition may be dispersed in the water-insoluble solvent, or the constitutional components of the pigment composition may be dispersed in the water-insoluble solvent. Specifically, the pigment dispersion is obtained as follows, for example. When necessary, the pigment dispersant and the resin are dissolved in the water-insoluble solvent. While the water-insoluble solvent is stirred, a pigment or a pigment composition powder is gradually added and sufficiently mixed with the water-insoluble solvent. Further, a mechanical shear force is applied by a dispersing machine such as a ball mill, a paint shaker, a dissolver, an Attritor, a sand mill, and a high speed mill. Thereby, the pigment can be stably finely dispersed in a state of a uniform fine particle.

The water-insoluble solvent usable for the pigment dispersion according to the present invention is determined according to the purpose and application of the pigment dispersion, and not particularly limited. Here, the water-insoluble solvent refers to solvents not soluble in water or solvents in which the amount of the solvent soluble in water at 25° C. is not more than 30% by mass based on the mass of water. Specifically, examples thereof include esters such as methyl acetate, ethyl acetate, and propyl acetate; hydrocarbons such as hexane, octane, isooctane, decane, isodecane, decalin, nonane, dodecane, isododecane, petroleum ether, cyclohexane, benzene, toluene, xylene, mineral spirits, Isopar E, Isopar G, Isopar H, Isopar L, Isopar M, and Isopar V made by Exxon Mobil Corporation, and ShellSol A100 and ShellSol A150 made by Shell Chemicals Japan Ltd.; halogen-containing hydrocarbons such as chloroform, carbon tetrachloride, dichloroethane, trichloroethylene, and tetrabromoethane; ketones such as methyl ethyl ketone, methyl isobutyl ketone, methyl-n-amylketone, and cyclohexanone; and glycol ether esters such as ethylene glycol monobutyl ether acetate, 3-methoxybutyl acetate, diethylene glycol monobutyl ether acetate, and propylene glycol monomethyl ether acetate.

The water-insoluble solvent usable for the pigment dispersion according to the present invention may be a polymerizable monomer. Specifically, examples thereof can include styrene monomers such as styrene, α-methylstyrene, α-ethylstyrene, o-methylstyrene, m-methylstyrene, p-methylstyrene, p-methoxystyrene, p-phenylstyrene, p-chlorostyrene, 3,4-dichlorostyrene, p-ethylstyrene, 2,4-dimethylstyrene, p-n-butylstyrene, p-tert-butylstyrene, p-n-hexylstyrene, p-n-octylstyrene, p-n-nonylstyrene, p-n-decylstyrene, and p-n-dodecylstyrene; olefin monomers such as ethylene, propylene, butylene, and isobutylene; halogenated vinyls such as vinyl chloride, vinylidene chloride, vinyl bromide, and vinyl iodide; vinyl esters such as vinyl acetate, vinyl propionate, and vinyl benzoate; methacrylate monomers such as methyl methacrylate, ethyl methacrylate, propyl methacrylate, butyl methacrylate, n-octyl methacrylate, dodecyl methacrylate, 2-ethylhexyl-methacrylate, stearyl methacrylate, behenyl methacrylate, phenyl methacrylate, dimethylaminoethyl methacrylate, diethylaminoethyl methacrylate, and methacrylonitrile; acrylate monomers such as methyl acrylate, ethyl acrylate, n-butyl acrylate, isobutyl acrylate, propyl acrylate, n-octyl acrylate, dodecyl acrylate, 2-ethylhexyl acrylate, stearyl acrylate, behenyl acrylate, 2-chloroethyl acrylate, acrylonitrile, acrylamide, and phenyl acrylate; vinyl ethers such as vinyl methyl ether, vinyl ethyl ether, and vinyl isobutyl ether; and vinyl ketone compounds such as vinyl methyl ketone, vinyl hexyl ketone, and methyl isopropenyl ketone. According to the application, these can be used singly or in combinations of two or more.

In order to improve the dispersibility of the pigment, when necessary, the water-insoluble solvent used for the pigment dispersion according to the present invention may contain an organic solvent that can be mixed with the water-insoluble solvent. Examples of usable organic solvents include alcohols or phenols such as methanol, ethanol, propanol, and phenol; ketones such as acetone; ethers such as diethyl ether, dipropyl ether, tetrahydrofuran, and dioxane; glycol ethers such as ethylene glycol monoethyl ether and diethylene glycol monoethyl ether; and aliphatic carboxylic acids such as acetic acid, and 2-ethylhexanoic acid, and acetic anhydrides or acid anhydrides thereof. These solvents can be used singly or in combinations of two or more.

The resin usable in the pigment dispersion according to the present invention is determined according to the purpose and application of the pigment composition, and not particularly limited. Specifically, examples of the resin include polystyrene resins, styrene copolymers, polyacrylic acid resins, polymethacrylic acid resins, polyacrylic acid ester resins, polymethacrylic acid ester resins, acrylic acid ester copolymers, methacrylic acid ester copolymers, polyester resins, polyvinyl ether resins, polyvinyl alcohol resins, and polyvinyl butyral resins. Other examples of the resin include polyurethane resins and polypeptide resins. Two or more of these resins can be mixed and used.

Next, the ink according to the present invention will be described.

The pigment dispersion according to the present invention is suitable for the colorant for an ink. Use of the pigment dispersion according to the present invention provides an ink in which the dispersibility of the pigment is kept well.

In order to adjust the surface tension or viscosity, the ink according to the present invention may contain the organic solvent that is used in the pigment dispersion and can be mixed with the water-insoluble solvent. Examples of usable organic solvents include alcohols or phenols such as methanol, ethanol, propanol, and phenol; ketones such as acetone; ethers such as diethyl ether, dipropyl ether, tetrahydrofuran, and dioxane; glycol ethers such as ethylene glycol monoethyl ether and diethylene glycol monoethyl ether; and aliphatic carboxylic acids such as acetic acid and 2-ethylhexanoic acid, and acetic anhydrides or acid anhydrides thereof. These solvents can be used singly or in combinations of two or more.

The pigment dispersion described in the present invention is always used as the colorant for the ink used in the present invention. The pigment dispersion can be used in combination with other colorant unless the dispersibility of the pigment dispersion according to the present invention is inhibited.

Examples of the colorant usable in combination include various compounds such as condensation azo compounds, isoindolinone compounds, anthraquinone compounds, azo metal complexes, methine compounds, and allylamide compounds. Specifically, C.I. Pigment Yellow 12, C.I. Pigment Yellow 13, C.I. Pigment Yellow 14, C.I. Pigment Yellow 15, C.I. Pigment Yellow 17, C.I. Pigment Yellow 62, C.I. Pigment Yellow 83, C.I. Pigment Yellow 94, C.I. Pigment Yellow 95, C.I. Pigment Yellow 97, C.I. Pigment Yellow 109, C.I. Pigment Yellow 110, C.I. Pigment Yellow 111, C.I. Pigment Yellow 120, C.I. Pigment Yellow 127, C.I. Pigment Yellow 129, C.I. Pigment Yellow 147, C.I. Pigment Yellow 151, C.I. Pigment Yellow 154, C.I. Pigment Yellow 168, C.I. Pigment Yellow 174, C.I. Pigment Yellow 176, C.I. Pigment Yellow 181, C.I. Pigment Yellow 185, C.I. Pigment Yellow 191, C.I. Pigment Yellow 194, C.I. Pigment Yellow 213, C.I. Pigment Yellow 214, C.I. Vat Yellows 1, 3, and 20, mineral fast yellow, navel yellow, Naphthol Yellow S, Hansa Yellow G, Permanent Yellow NCG, C.I. Solvent Yellow 9, C.I. Solvent Yellow 17, C.I. Solvent Yellow 24, C.I. Solvent Yellow 31, C.I. Solvent Yellow 35, C.I. Solvent Yellow 58, C.I. Solvent Yellow 93, C.I. Solvent Yellow 100, C.I. Solvent Yellow 102, C.I. Solvent Yellow 103, C.I. Solvent Yellow 105, C.I. Solvent Yellow 112, C.I. Solvent Yellow 162, C.I. Solvent Yellow 163, C.I. Pigment Red 9, C.I. Pigment Red 97, C.I. Pigment Red 122, C.I. Pigment Red 146, C.I. Pigment Red 168, C.I. Pigment Red 177, C.I. Pigment Red 216, C.I. Pigment Red 224, C.I. Pigment Red 226, C.I. Pigment Red 242, C.I. Pigment Red 254, C.I. Pigment Green 7, C.I. Pigment Green 36, poly(12 to 16)bromophthalocyanine green, C.I. Pigment Blue −15:3, C.I. Pigment Blue 15:6, C.I. Pigment Blue 60, C.I. Pigment Violet 19, C.I. Pigment Violet 23, and the like can be used.

Further, when the ink is produced, various additives other than the components above such as a plasticizer, a surfactant, a viscosity control agent, an antifoaming agent, an ultraviolet absorbing agent, a rust inhibitor, an antioxidant, a reduction inhibitor, an evaporation accelerator, and a chelating agent may be contained when necessary.

The ink according to the present invention has high dispersibility of the pigment and a good color tone. Accordingly, if the composition is used as a resist composition for a color filter described later, the ink according to the present invention can be used as an ink for a color filter.

Next, the resist composition for a color filter according to the present invention will be described.

The pigment dispersion according to the present invention is suitable for a colorant for the resist composition for a color filter containing at least a binder resin and a colorant. Use of the pigment dispersion according to the present invention provides a resist composition for a color filter in which the dispersibility of the pigment is kept well and the color properties are high.

In the color filter in which two or more pixels having different spectral characteristics from each other are arranged adjacently on a substrate, the pigment dispersion according to the present invention is used in at least one of the pixels (such as red, green, and blue). Thereby, a pixel having high transparency and high color purity can be obtained. Particularly, if the pigment dispersion according to the present invention is used as a colorant for toning the green pixel and the red pixel, a resist composition for a color filter having high color properties is provided.

Examples of the binder resin usable for the resist composition for a color filter according to the present invention include known non-reactive random copolymers, block copolymers, and graft copolymers; copolymers having a reactive group; middle molecular weight oligomers having a reactive group; monomers having a reactive group; or polymers containing a crosslinking agent. The reactive group is determined according to a method of curing a color ink. Examples of the reactive group include known reactive groups such as a methylol group, an isocyanate group, an epoxy group, an oxetane group, a vinyl group, an acroyl group, a methacryloyl group, a hydroxyl group, a carboxyl group, an amino group, and an imino group, and reactive derivatives thereof.

Examples of a monomer that forms a thermal dry or thermal crosslinking polymer include alkyl esters, cycloalkyl esters, and alkylcycloalkyl esters, of α,β-ethylenic unsaturated carboxylic acids such as acrylic acid and methacrylic acid; and aromatic vinyl monomers such as ethylene, propylene, butylene, isobutylene, butadiene, isoprene, styrene, α-methylstyrene, and vinylnaphthalene. Examples of a macromonomer having a hydrophobic molecule chain include macromonomers in which an α,β-ethylenic unsaturated group is bonded to a homopolymer chain or copolymer chain of the monomer having a hydrophobic group.

Examples of the reactive monomer that forms a thermal dry or thermal crosslinking polymer include acrylic acid, methacrylic acid, and maleic acid having a carboxyl group; 2-hydroxyalkyl acrylate and 2-hydroxyalkyl methacrylate having a hydroxyl group; glycidyl acrylate and glycidyl methacrylate having an epoxy group; N-methylolacrylamide, N-methylolmethacrylamide, N-methoxymethylacrylamide, N-methoxymethylmethacrylamide, N-methylolmelamine, and N-methylolbenzoguanamine having a methylol group; γ-methacryloxypropyltrimethoxysilane having a silane group; and isocyanateethyl acrylate, isocyanateethyl methacrylate, and 2-(p-isopropenylphenyl)propyl(-2)isocyanate having an isocyanate group. Examples of the macromonomer having a molecule chain having a group that reacts with a crosslinking agent include macromonomers in which an α,β-ethylenic unsaturated group is bonded to the (co)polymer chain of the reactive monomer shown above or to the copolymer chain of the reactive monomer and the hydrophobic monomer shown above.

Examples of the crosslinking agent include trimethyloipropane polyglycidyl ether and pentaerythritol polyglycidyl ether having an epoxy group; methoxymethylolated melamine, butoxymethylolmelamine, and methoxymethylolbenzoguanamine having a methylol group; multi-branched polycarbodiimide that is an urethane reaction product of poly(hexamethylenecarbodiimide)diisocyanate having a carbodiimide group with bis-monomethoxypolyethylene glycol and polyoxyethylene sorbit monolaurate; and masked isocyanates including phenols of trimethylolpropane-tris(tolylene diisocyanate aduct) and trimethylolpropane-tris(hexamethylene diisocyanate aduct) having an isocyanate group.

Monomers, oligomers, and polymers having a known addition polymerizable or addition crosslinkable unsaturated double bond or a polymerizable cyclic ether group are used as a binder resin for UV radical curing inks, photocationic polymerizing inks, electron beam curing inks, and thermal polymerizing inks.

Examples of the addition polymerizable oligomers and polyfunctional monomers include urethane acrylates such as (polytetramethylene glycol-hexamethylene diisocyanate polyurethane)-bisacrylate; epoxy acrylates such as bisphenol A epoxy resin-bisacrylate and phenol novolak epoxy resin-polyacrylate; poly(hexyleneisophthalate)-bisacrylate, (trimethylolpropane-adipic acid polyester)-polyacrylate, tetraethylene glycol diacrylate, tripropylene glycol diacrylate, tricyclodecane dimethanol diacrylate, diacrylates of bisphenol A-ethyleneoxide adducts, trimethylolpropane triacrylate, pentaerythritol triacrylate, pentaerythritol tetraacrylate, and dipentaerythritol hexaacrylate.

Examples of alicyclic diepoxy compounds include 3,4-epoxycyclohexylmethyl(3,4-epoxy)cyclohexane carboxylate and limonene dioxide. Examples of oxetane compounds include oxetane alcohol, dioxetane, phenyl oxetane, xylylene dioxetane, and 2-ethylhexyloxetane. Examples of vinyl ether compounds include triethylene glycol divinyl ether and 1,4-cyclohexanedimethanol divinyl ether.

In the case where the resist composition for a color filter according to the present invention is a UV radical curing type, a photocationic polymerization type, an electron beam curing type, or a thermal polymerization type, the resist composition includes an initiator. The initiator usable for the resist composition for a color filter according to the present invention is not particularly limited. Examples of a photopolymerization initiator include 1-hydroxycyclohexyl-phenylketone, 2,2-dimethoxy-1,2-diphenylethane-1-one, 2-methyl-1-[4-(methylthio)phenyl]-2-morpholinopropane-1-one, 2-benzyl-2-dimethylamino-1-(4-morpholinophenyl)-butane-1-one, 2-hydroxy-2-methyl-1-phenyl-propane-1-one, 1-[4-(2-hydroxyethoxy)phenyl]-2-hydroxy-2-methyl-1-propane-1-one, 2,4,6-trimethylbenzoyldiphenyl-phosphine oxide, bisacyl phosphine oxide, benzoin ethyl ether, benzoin isobutyl ether, benzoin isopropyl ether, 2-isopropylthioxanthone, 2,4-diethylthioxanthone, 2-(3-dimethylamino-2-hydroxypropoxy)-3,4-dimethyl-9H-thioxanthone-9-one mesochloride, benzophenone, methyl o-benzoylbenzate, 4-benzoyl-4'-methyl-diphenylsulfide, 3,3',4,4'-tetra(tert-butylperoxycarbonyl), p-dimethylaminoethyl benzoate ester, p-dimethylaminobenzoic acid isoamyl ester, 1,3,5-triacryloylhexahydro-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, benzoylmethyl formate, and 2,4,6-trimethylbenzoyldiphenylphosphine oxide. Examples of a photocationic polymerization initiator include triaryl sulfonium salts and aryl iodonium salts. Examples of a sensitizer include 1-chloro-4-propoxythioxanthone. Examples of a thermal polymerization initiator include azobisisobutyronitrile, azobis(cyanoisovaleric acid), and dimethyl 2,2'-azobisisobutyrate.

In order to dissolve or disperse the binder resin, the polymerization initiator, the colorant, and the like well, when necessary, the resist composition for a color filter according to the present invention may contain an organic solvent that can be mixed with the water-insoluble solvent used in the pigment dispersion. Examples of usable organic solvents include alcohols or phenols such as methanol, ethanol, propanol, and phenol; ketones such as acetone; ethers such as diethyl ether, dipropyl ether, tetrahydrofuran, and dioxane; glycol ethers such as ethylene glycol monoethyl ether and diethylene glycol monoethyl ether; and aliphatic carboxylic acids such as acetic acid and 2-ethylhexanoic acid, and acetic anhydrides or acid anhydrides thereof. These solvents can be used singly or in combinations of two or more.

Further, in the case where the resist composition for a color filter according to the present invention is applied onto a glass substrate, a silane coupling agent having a reactive organic functional group is added to the composition. Thereby, adhesion of a colored film to be formed to the glass substrate can be improved, resulting in high coating performance. As these compounds, a known silane coupling agent is used. Examples of the silane coupling agent having a reactive organic functional group include silane coupling agents having an epoxy group, a thiol group, a hydroxyl group, an amino group, an ureido group, a vinyl group, and an acroyl group. Specifically, examples thereof include β-(3,4-epoxycyclohexyl)ethyltrimethoxysilane, γ-glycidoxypropyltrimethoxysilane, γ-mercaptopropyltrimethoxysilane, γ-aminopropyltriethoxysilane, N-β-(aminoethyl)-γ-aminopropyltrimethoxysilane, γ-ureidopropyltriethoxysilane, vinyltriethoxysilane, vinyl-tris(β-methoxyethoxy)silane, and γ-methacryloxypropyltrimethoxysilane.

As above, the resist composition for a color filter according to the present invention includes the pigment dispersion according to the present invention as the colorant, and therefore can provide a resist composition for a color filter in which the dispersibility of the pigment is kept well and the color properties are high.

EXAMPLES

Hereinafter, the present invention will be more specifically described using Examples and Comparative Examples, but the present invention will not be limited to Examples below unless departing from the gist. In the description below, "parts" and "%" are based on the mass unless otherwise specified.

Hereinafter, measurement methods used in Examples will be shown.

(1) Measurement of Molecular Weight

The molecular weights of the polymer resin unit and compound having the bisazo skeleton unit according to the present invention are calculated in terms of polystyrene using size exclusion chromatography (SEC). The measurement of the molecular weight by SEC was performed as follows.

A sample was added to an eluent shown below such that the concentration of the sample was 1.0%. The obtained solution was left as it was at room temperature for 24 hours, and filtered with a solvent-resistant membrane filter having a pore diameter of 0.2 μm. This was used as the sample solution, and measured on the condition below:
apparatus: high speed GPC apparatus "HLC-8220GPC" [made by Tosoh Corporation]
columns: two columns of LF-804
eluent: THF
flow rate: 1.0 ml/min
oven temperature: 40° C.
amount of sample to be injected: 0.025 ml In calculation of the molecular weight of the sample, a molecular weight calibration curve created using standard polystyrene resins [made by Tosoh Corporation, TSK Standard Polystyrenes F-850, F-450, F-288, F-128, F-80, F-40, F-20, F-10, F-4, F-2, F-1, A-5000, A-2500, A-1000, and A-500] was used.

(2) Measurement of Acid Value

The acid values of the polymer resin unit and compound having the bisazo skeleton unit according to the present invention are determined by the method shown below.

The basic operation is according to JIS K-0070.
1) 0.5 to 2.0 g of a sample is precisely weighed. The mass at this time is defined W (g).
2) The sample is placed in a 50 ml beaker. 25 ml of a mixed solution of tetrahydrofuran/ethanol (2/1) is poured, and the sample is dissolved.
3) Using an ethanol solution of 0.1 mol/l KOH, titration is performed using a potentiometric titrator [for example, an Automatic Titrator "COM-2500" made by Hiranuma Sangyo Co., Ltd. or the like can be used].
4) The amount of the KOH solution to be used at this time is defined as S (ml). At the same time, a blank sample is measured. The amount of KOH to be used at this time is defined as B (ml).
5) The acid value is calculated by the following equation. f is a factor of the KOH solution.

$$\text{Acid Value} [\text{mg KOH}/g] = \frac{(S-B) \times f \times 5.61}{W}$$

(3) Analysis of Composition

The structures of the polymer resin unit and compound having the bisazo skeleton unit according to the present invention were determined using the apparatus below.
$^1$H NMR
ECA-400 made by JEOL, Ltd. (solvent used: deuterochloroform)

Example 1

The compound having bisazo skeleton unit represented by formula (1) or (2) was obtained by the method below.

<Production Example of Compound (25)>
A compound (25) having the bisazo skeleton unit and having the structure was produced according to the scheme below:
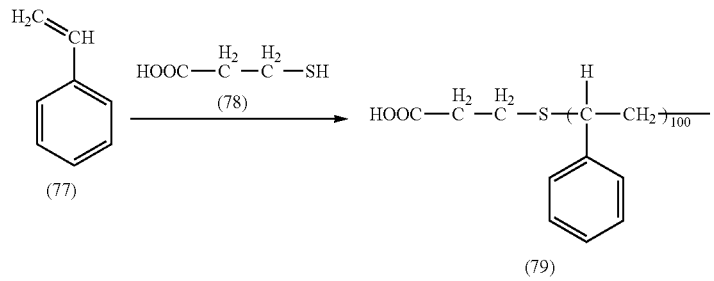
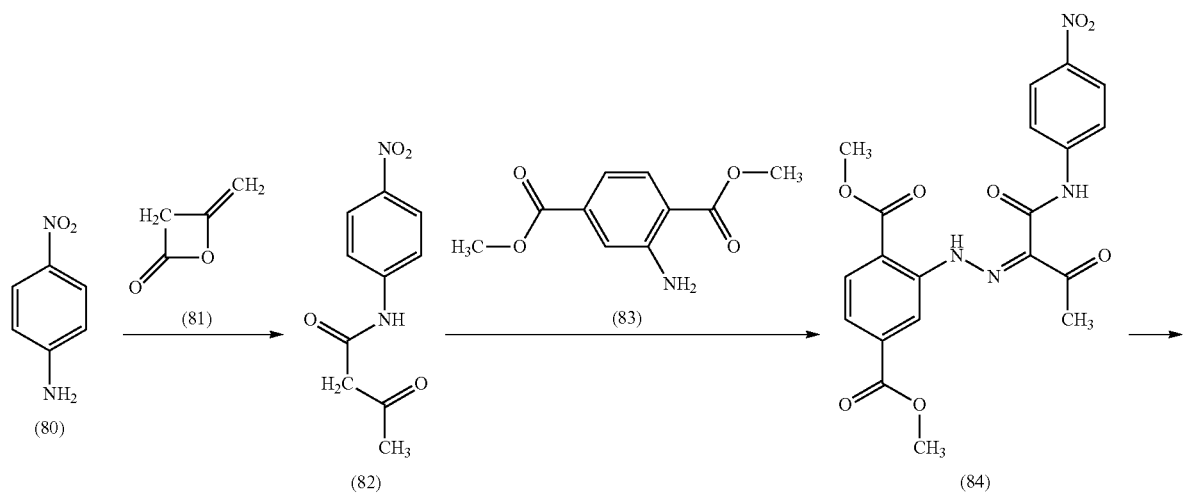
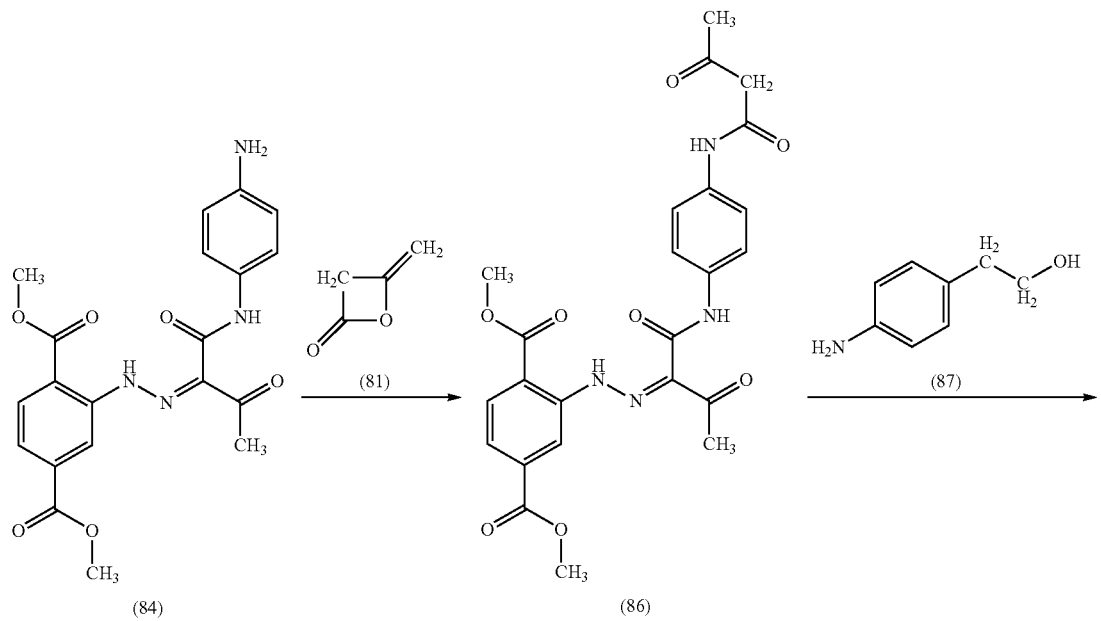

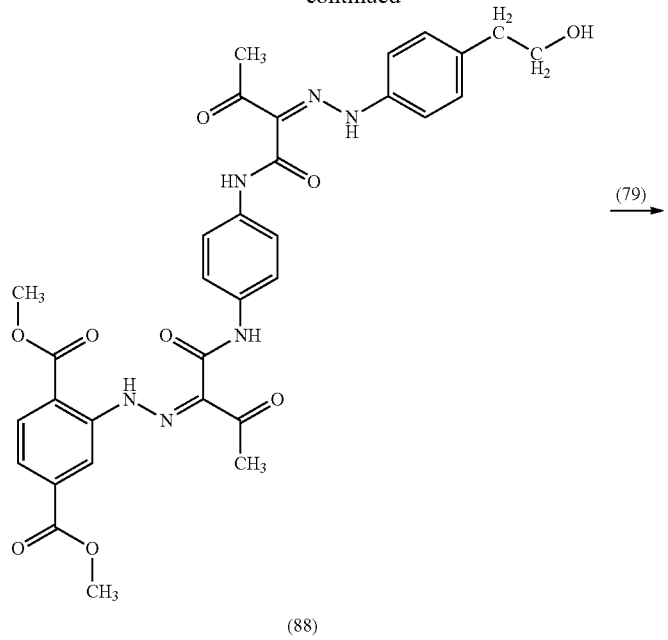

(88)

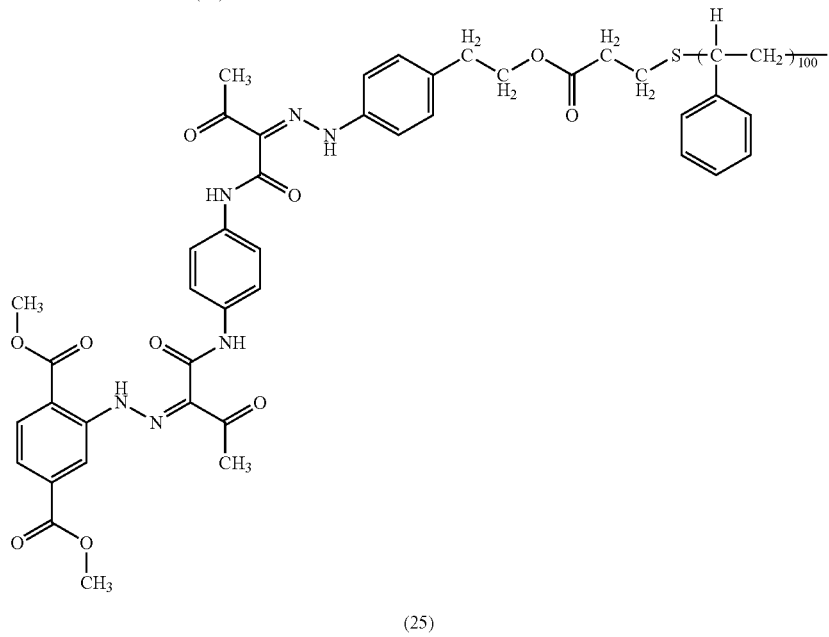

(25)

First, while replacement with nitrogen was performed, 100 parts of propylene glycol monomethyl ether was heated, and refluxed at a solution temperature of 120° C. or more. A mixture of 100 parts of styrene, 1.2 parts of β-mercaptopropionic acid, and 1.0 part of tert-butylperoxybenzoate [organic peroxide polymerization initiator PERBUTYL Z (registered trademark) (made by NOF CORPORATION)] was dropped into the solution over 3 hours. After dropping was completed, the solution was stirred for 3 hours. While the solution temperature was raised to 170° C., distillation was performed at normal pressure. After the solution temperature reached 170° C., distillation was performed under a reduced pressure of 1 hPa for 1 hour. Thus, the solvent was removed to obtain a polymer solid product. The solid product was dissolved in tetrahydrofuran, and reprecipitated with n-hexane. The precipitated solid was filtered to obtain a polymer resin unit (79).

Next, 3.11 parts of p-nitroaniline (80) was added to 30 parts of chloroform, and the obtained solution was cooled with ice to 10° C. or less. Then, 1.89 parts of diketene (81) was added thereto. Subsequently, the solution was stirred at 65° C. for 2 hours. After the reaction was completed, the product was extracted with chloroform, and condensed to obtain 4.70 parts of a compound (82) (yield of 94.0%).

Next, 40.0 parts of methanol and 5.29 parts of concentrated hydrochloric acid were added to 4.25 parts of 2-aminodimethyl terephthalate (83), and the mixed solution was cooled with ice to 10° C. or less. A solution in which 2.10 parts of sodium nitrite was dissolved in 6.00 parts of water was added to the solution to make a reaction for 1 hour at the same temperature as above. Next, 0.990 parts of sulfamic acid was added to the solution, and the solution was stirred for 20 minutes (diazonium salt solution). 4.51 parts of the compound (82) was added to 70.0 parts of methanol. The obtained solution was cooled with ice to 10° C. or less, and the diazonium salt solution was added. Subsequently, a solution in which 5.83 parts of sodium acetate was dissolved in 7.00 parts of water was added to make a reaction for 2 hours at 10° C. or less. After the reaction was completed, 300 parts of water was added to the reaction solution, and the reaction solution was stirred for 30 minutes. Then, a solid was filtered, and refined by recrystallization from N,N-dimethylformamide to obtain 8.71 parts of a compound (84) (yield of 96.8%).

Next, 8.58 parts of the compound (84) and 0.40 parts of palladium-activated carbon (5% of palladium) were added to 150 parts of N,N-dimethylformamide, and stirred for 3 hours at 40° C. under a hydrogen gas atmosphere (reaction pressure of 0.1 to 0.4 MPa). After the reaction was completed, the solution was filtered, and condensed to obtain 6.99 parts of a compound (85) (yield of 87.5%).

Next, 6.50 parts of the compound (85) was added to 30.0 parts of chloroform. The solution was cooled with ice to 10° C. or less, and 0.95 parts of diketene (81) was added. Subsequently, the solution was stirred for 2 hours at 65° C. After the reaction was completed, the reaction product was extracted with chloroform, and condensed to obtain 7.01 parts of an azo compound intermediate product (86) (yield of 94.2%).

Next, 15.0 parts of methanol and 1.48 parts of concentrated hydrochloric acid were added to 1.78 parts of 2-(4-nitrophenyl)ethanol (87), and the solution was cooled with ice to 10° C. or less. A solution in which 1.08 parts of sodium nitrite was dissolved in 3.00 parts of water was added to the solution to make a reaction for 1 hour at the same temperature as above. Next, 0.380 parts of sulfamic acid was added to the reaction solution, and the reaction solution was stirred for 20 minutes (diazonium salt solution). A solution in which 7.18 parts of potassium carbonate was dissolved in 7.00 parts of water and 6.50 parts of the compound (86) were added to 70.0 parts of N,N-dimethylformamide. The obtained solution was cooled with ice to 10° C. or less. The diazonium salt solution was added thereto to make a reaction for 2 hours at 10° C. or less. After the reaction was completed, 300 parts of water was added to the solution, and the solution was stirred for 30 minutes. Then, a solid was filtered, and refined by recrystallization from N,N-dimethylformamide to obtain 7.62 parts of a compound (88) (yield of 91.0%).

Next, 0.689 parts of the compound (88) was added to 100 parts of dehydrated N-methylpyrrolidone, and the solution was heated to 100° C. to dissolve the compound (88). After the dissolution, the temperature was dropped to 50° C. 10.0 parts of the polymer (A) dissolved in 30 parts of dehydrated N-methylpyrrolidone was added, 0.349 parts of 1-ethyl-3-(3-dimethylaminopropyl) carbodiimide.hydrochloric acid salt was added, and the solution was stirred for 3 hours at 50° C. The solution temperature was gradually returned to normal temperature, and stirring was performed overnight to complete the reaction. After the reaction was completed, the solution was condensed, and separated with chloroform. After extraction, refining by silica gel column chromatography, and reprecipitation with methanol were subsequently performed to obtain 8.51 parts of the compound (25).

From the measurements using the apparatuses, it was found that the obtained product has the structure represented by the formula above. The results of analysis are shown below.

Result of Analysis of Compound (25) Having Bisazo Skeleton Unit

[1] Results of measurement of molecular weight (GPC): weight average molecular weight (Mw)=17993, number average molecular weight (Mn)=10742

[2] Result of measurement of acid value: 0 mgKOH/g

[3] Results of $^1$H NMR (400 MHz, CDCl$_3$ at room temperature) (see FIG. 1): δ [ppm]=15.65 (s, 1H), 14.76 (s, 1H), 11.49 (s, 1H), 11.40 (s, 1H), 8.62 (s, 1H), 8.15 (d, 1H), 7.80 (d, 1H), 7.74 (d, 2H), 7.64 (d, 2H), 7.37-6.27 (m, 550H), 4.24 (br, 1H), 4.07 (s, 3H), 3.98 (s, 3H), 3.73 (br, 1H), 3.24-2.84 (m, 10H), 2.69 (s, 3H), 2.57 (s, 3H), 2.45-0.77 (m, 330H)

<Production Example of Compound (45)>

A compound (45) having a bisazo skeleton unit and having the structure was produced according to the scheme below:

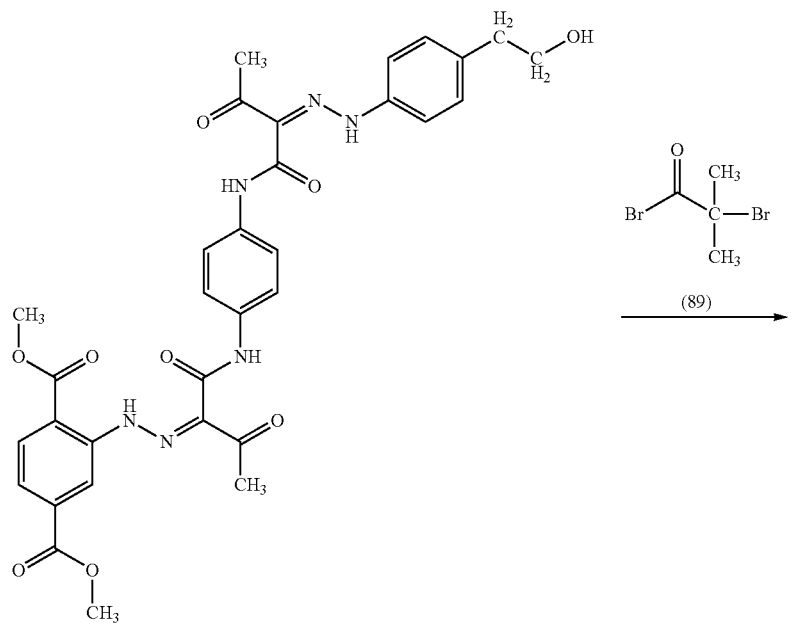

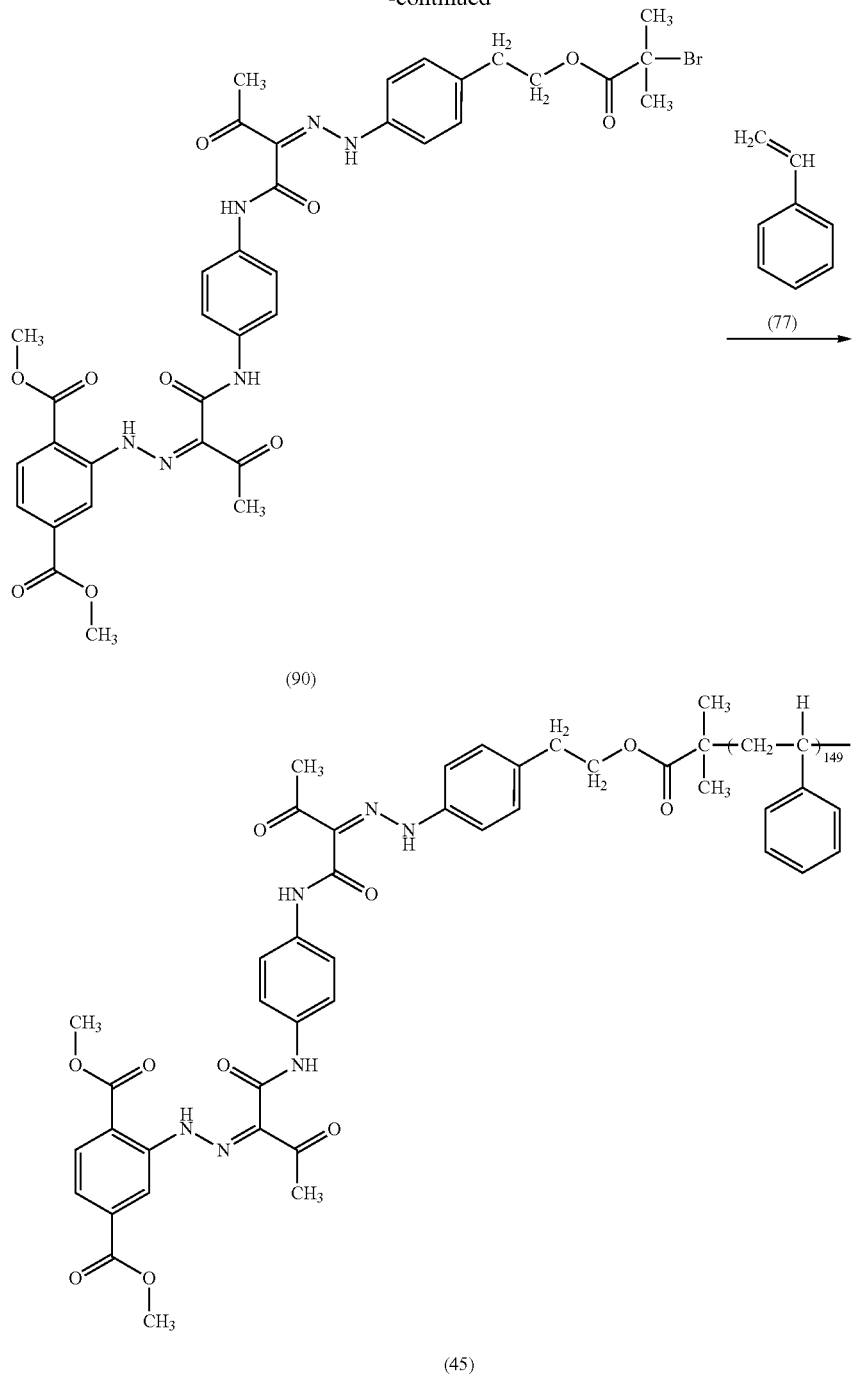

First, the same operation as that in Production Example of the compound (25) was performed to obtain a compound (85).

Next, 2.00 parts of the compound (88) was added to 20.0 parts of chloroform. The solution was cooled with ice to 10° C. or less, and 0.855 parts of 2-bromoisobutyrylbromide (89) was added. Subsequently, the solution was stirred for 2 hours at 65° C. After the reaction was completed, the reaction product was extracted with chloroform, and condensed to obtain 2.26 parts of an intermediate product (90) (yield of 92.0%).

Next, 0.684 parts of the compound (90), 27.3 parts of styrene (77), 0.305 parts of N,N,N',N'',N''-pentamethyldiethylenetriamine, and 0.124 parts of copper(I) bromide were added to 10.0 parts of N,N-dimethylformamide. Subsequently, under a nitrogen atmosphere, stirring was performed at 100° C. for 7.5 hours. After the reaction was completed, the reaction product was extracted with chloroform, and refined by reprecipitation with methanol to obtain 8.50 parts of a compound (45).

From the measurements using the apparatuses, it was found that the obtained product has the structure represented by the formula above. The results of analysis are shown below.

Result of Analysis of Compound (45) Having Bisazo Skeleton Unit

[1] Results of measurement of molecular weight (GPC): weight average molecular weight (Mw)=15117, number average molecular weight (Mn)=12910

[2] Result of measurement of acid value: 0 mgKOH/g

Figure 2:
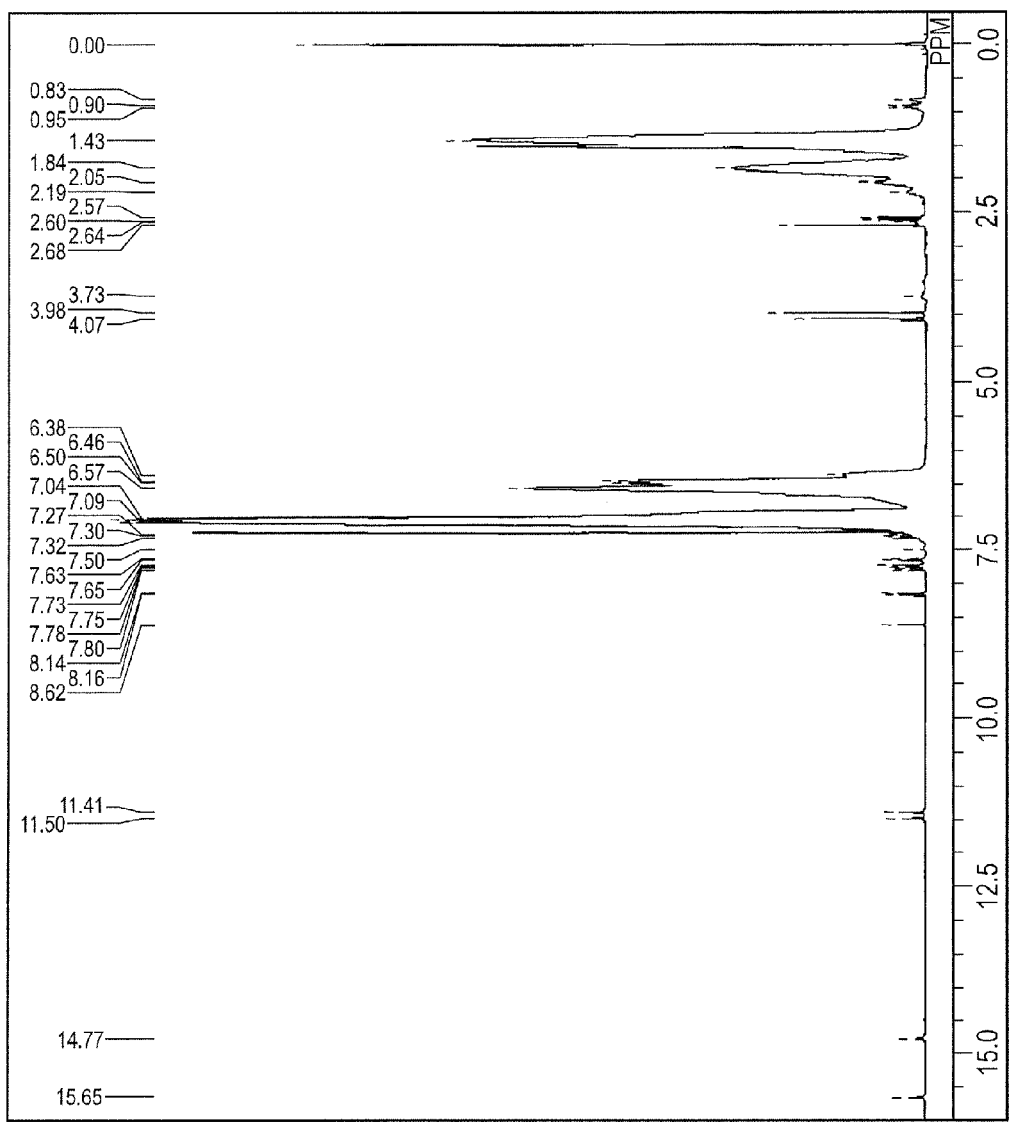
FIG. 2 is a drawing illustrating a $^1$H NMR spectrum at room temperature and 400 MHz of a compound (45) having a bisazo skeleton unit according to the present invention in CDCl$_3$.

[3] Results of $^1$H NMR (400 MHz, CDCl$_3$ at room temperature) (see FIG. 2): δ [ppm]=15.65 (s, 1H), 14.77 (s, 1H), 11.40 (s, 1H), 11.41 (s, 1H), 8.62 (s, 1H), 8.15 (d, 1H), 7.79 (d, 1H), 7.74 (d, 2H), 7.64 (d, 2H), 7.37-6.27 (m, 738H), 4.07 (s, 3H), 3.98 (s, 3H), 3.73 (br, 2H), 2.72-2.52 (m, 9H), 2.47-1.05 (m, 458H), 1.01-0.78 (m, 6H)

The same operation as that in Production Examples of compounds (25) and (45) having the bisazo skeleton unit was performed to produce compounds (26) to (44) and (46) to (76) having the bisazo skeleton unit represented by formula (1) or (2). The compounds having the bisazo skeleton unit according to the present invention are shown in Table 1 below.

TABLE 1

| Compound | Sequential arrangement of monomers | Number of X | Number of Y | Number of Z | Kind of W | Number of W | $R_1$ | $R_2$ | $R_3$ | $R_4$ | $R_5$ | $R_6$ | $R_7$ | $R_8$ | $R_9$ | $R_{10}$ | $R_{11}$ | $R_{19}$ |
|---|---|---|---|---|---|---|---|---|---|---|---|---|---|---|---|---|---|---|
| (25) | α-W-polyX | 110 | 0 | 0 | W-1 | 1 | H | H | H | H | $CH_3$ | $CH_3$ | H | $COOCH_3$ | H | H | $COOCH_3$ | H |
| (26) | α-W-poly(X-co-Y) | 71 | 18 | 0 | W-1 | 1 | H | H | H | H | $CH_3$ | $CH_3$ | H | $COOCH_3$ | H | H | $COOCH_3$ | H |
| (27) | α-W-poly(X-co-Y) | 43 | 54 | 0 | W-1 | 1 | H | H | H | H | $CH_3$ | $CH_3$ | H | $COOCH_3$ | H | H | $COOCH_3$ | H |
| (28) | α-W-poly(X-co-Y) | 18 | 88 | 0 | W-1 | 1 | H | H | H | H | $CH_3$ | $CH_3$ | H | $COOCH_3$ | H | H | $COOCH_3$ | H |
| (29) | α-W-polyY | 0 | 101 | 0 | W-1 | 1 | H | H | H | H | $CH_3$ | $CH_3$ | H | $COOCH_3$ | H | H | $COOCH_3$ | H |
| (30) | α-W-poly(X-co-Y) | 78 | 23 | 0 | W-1 | 1 | H | H | H | H | $CH_3$ | $CH_3$ | H | $COOCH_3$ | H | H | $COOCH_3$ | H |
| (31) | α-W-poly(X-co-Y) | 74 | 26 | 0 | W-1 | 1 | H | H | H | H | $CH_3$ | $CH_3$ | H | $COOCH_3$ | H | H | $COOCH_3$ | H |
| (32) | α-W-poly(X-co-Y) | 51 | 48 | 0 | W-1 | 1 | H | H | H | H | $CH_3$ | $CH_3$ | H | $COOCH_3$ | H | H | $COOCH_3$ | H |
| (33) | α-W-poly(X-co-Y) | 70 | 29 | 0 | W-1 | 1 | H | H | H | H | $CH_3$ | $CH_3$ | H | $COOCH_3$ | H | H | $COOCH_3$ | H |
| (34) | α-W-polyX | 99 | 0 | 0 | W-1 | 1 | H | H | H | H | $CH_3$ | $CH_3$ | H | $COOCH_3$ | H | H | $COOCH_3$ | H |
| (35) | α-W-poly(X-co-Y) | 19 | 87 | 0 | W-1 | 1 | H | H | H | H | $CH_3$ | $CH_3$ | H | $COOCH_3$ | H | H | $COOCH_3$ | H |
| (36) | α-W-polyX | 100 | 0 | 0 | W-1 | 1 | H | H | H | H | $CH_3$ | $CH_3$ | H | $COOCH_3$ | H | H | $COOCH_3$ | H |
| (37) | α-W-poly(X-co-Y) | 71.2 | 17 | 0 | W-1 | 1 | H | H | H | H | $CH_3$ | $CH_3$ | H | $COOCH_3$ | H | H | $COOCH_3$ | H |
| (38) | α-W-poly(X-co-Y) | 72.2 | 18 | 0 | W-1 | 1 | H | H | H | H | $CH_3$ | $CH_3$ | H | $COOCH_3$ | H | H | $COOCH_3$ | H |
| (39) | α-W-poly(X-co-Y) | 18 | 88 | 0 | W-1 | 1 | H | H | H | H | $CH_3$ | $CH_3$ | H | $COOCH_3$ | H | H | $COOCH_3$ | H |
| (40) | α-W-polyX | 100 | 0 | 0 | W-1 | 1 | H | H | H | H | $CH_3$ | $CH_3$ | H | $COOCH_3$ | H | H | $COOCH_3$ | H |
| (41) | α-W-poly(X-co-Y) | 73 | 20 | 0 | W-1 | 1 | H | H | H | H | $CH_3$ | $CH_3$ | H | $COOCH_3$ | H | H | $COOCH_3$ | H |
| (42) | α-W-polyX | 100 | 0 | 0 | W-1 | 1 | H | H | H | H | $CH_3$ | $CH_3$ | H | $COOCH_3$ | H | H | $COOCH_3$ | H |

TABLE 1-continued

Compound having bisazo skeleton unit according to the present invention

| | | | | | | | | | | | | | | | | | | |
|---|---|---|---|---|---|---|---|---|---|---|---|---|---|---|---|---|---|---|
| (43) | α-W-poly(X-co-Y) | 74 | 19 | 0 | W-1 | 1 | H | H | H | CH$_3$ | CH$_3$ | H | COOCH$_3$ | H | H | COOCH$_3$ | H |
| (44) | polyX-blk-W-blk-poly | 100 | 0 | 0 | W-1 | 1 | H | H | H | CH$_3$ | CH$_3$ | H | COOCH$_3$ | H | H | COOCH$_3$ | H |
| (45) | polyX-α-W-poly | 149 | 0 | 0 | W-1 | 1 | H | H | H | CH$_3$ | CH$_3$ | H | COOCH$_3$ | H | H | COOCH$_3$ | H |
| (46) | polyX-α-W-poly | 434 | 0 | 0 | W-1 | 1 | H | H | H | CH$_3$ | CH$_3$ | H | COOCH$_3$ | H | H | COOCH$_3$ | H |
| (47) | polyX-poly(X-co-Y-co-Z-co-W) | 142 | 28 | 6 | W-1 | 5 | H | H | H | CH$_3$ | CH$_3$ | H | COOCH$_3$ | H | H | COOCH$_3$ | H |
| (48) | poly(X-co-Y-co-Z-co-W) | 141 | 30 | 0 | W-1 | 11 | H | H | H | CH$_3$ | CH$_3$ | H | COOCH$_3$ | H | H | COOCH$_3$ | H |
| (49) | poly(X-co-Y-co-Z-co-W) | 142 | 29 | 9 | W-1 | 2 | H | H | H | CH$_3$ | CH$_3$ | H | COOCH$_3$ | H | H | COOCH$_3$ | H |
| (50) | poly(X-co-Y-co-Z-co-W) | 74 | 14 | 1 | W-1 | 1 | H | H | H | CH$_3$ | CH$_3$ | H | COOCH$_3$ | H | H | COOCH$_3$ | H |
| (51) | poly(X-co-Y)-blk-poly(Z-co-W) | 227 | 0 | 3 | W-1 | 8 | H | H | H | CH$_3$ | CH$_3$ | H | COOCH$_3$ | H | H | COOCH$_3$ | H |
| (52) | poly(X-co-Z-co-W) | 228 | 0 | 3 | W-1 | 8 | H | H | H | CH$_3$ | CH$_3$ | H | COOCH$_3$ | H | H | COOCH$_3$ | H |
| (53) | polyX-blk-polyW | 84 | 0 | 0 | W-1 | 5 | H | H | H | CH$_3$ | CH$_3$ | H | COOCH$_3$ | H | H | COOCH$_3$ | H |
| (54) | poly(X-co-Z-co-W) | 0 | 90 | 2 | W-1 | 8 | H | H | H | CH$_3$ | CH$_3$ | H | COOCH$_3$ | H | H | COOCH$_3$ | H |
| (55) | poly(X-co-Y-co-Z-co-W) | 10 | 11 | 5 | W-1 | 2 | H | H | H | CH$_3$ | CH$_3$ | H | COOCH$_3$ | H | H | COOCH$_3$ | H |
| (56) | poly(X-co-Z-co-W) | 1174 | 0 | 384 | W-1 | 197 | H | H | H | CH$_3$ | CH$_3$ | H | COOCH$_3$ | H | H | COOCH$_3$ | H |
| (57) | poly(X-co-Y-co-W) | 15 | 11 | 0 | W-1 | 5 | H | H | H | CH$_3$ | CH$_3$ | H | COOCH$_3$ | H | H | COOCH$_3$ | H |
| (58) | poly(X-co-Y-co-W) | 16 | 13 | 0 | W-1 | 4 | H | H | H | CH$_3$ | CH$_3$ | H | COOCH$_3$ | H | H | COOCH$_3$ | H |
| (59) | α-W-polyX | 140 | 0 | 0 | W-1 | 1 | H | H | H | C$_6$H$_{13}$(n) | Ph | H | COOCH$_3$ | H | H | COOCH$_3$ | H |

TABLE 1-continued

Compound having bisazo skeleton unit according to the present invention

| Compound |   |   |   |   |   |   |   |   |   |   |   |   |   |   |   |   |   |
|---|---|---|---|---|---|---|---|---|---|---|---|---|---|---|---|---|---|
| (60) | α-W- | 145 | W-1 | 1 | 0 | Cl | H | H | CH₃ | COOCH₃ | H | H | COOCH₃ | H |
| (61) | polyX-W- | 146 | W-1 | 1 | 0 | Cl | H | Cl | CH₃ | COOCH₃ | H | H | COOCH₃ | H |
| (62) | α-W- | 151 | W-1 | 1 | 0 | H | H | H | CH₃ | COOH | H | H | COOH | H |
| (63) | polyX-W- | 149 | W-1 | 1 | 0 | H | H | H | CH₃ | COOC₂H₅ | H | H | COOC₂H₅ | H |
| (64) | α-W- | 152 | W-1 | 1 | 0 | H | H | H | CH₃ | COOPr(n) | H | H | COOPr(n) | H |
| (65) | polyX-W- | 151 | W-1 | 1 | 0 | H | H | H | CH₃ | COOPr(i) | H | H | COOPr(i) | H |
| (66) | α-W- | 151 | W-1 | 1 | 0 | H | H | H | CH₃ | CONH₂ | H | H | CONH₂ | H |
| (67) | polyX-W- | 153 | W-1 | 1 | 0 | H | H | H | CH₃ | CONHCH₃ | H | H | CONHCH₃ | H |
| (68) | α-W- | 148 | W-1 | 1 | 0 | H | H | H | CH₃ | CONHC₂H₅ | H | H | CONHC₂H₅ | H |
| (69) | polyX-W- | 146 | W-1 | 1 | 0 | H | H | H | CH₃ | COOPr(n) | H | H | COOPr(n) | H |
| (70) | α-W- | 144 | W-1 | 1 | 0 | H | H | H | CH₃ | CON(C₂H₅)₂ | H | H | CON(C₂H₅)₂ | H |
| (71) | polyX-W- | 149 | W-1 | 1 | 0 | H | H | H | CH₃ | COOCH₃ | H | H | COOCH₃ | H |
| (72) | α-W- | 149 | W-1 | 1 | 0 | H | H | H | CH₃ | H | COOCH₃ | H | H | H |
| (73) | polyX-W- | 150 | W-1 | 1 | 0 | H | H | H | CH₃ | H | H | COOCH₃ | H | H |
| (74) | α-W- | 150 | W-1 | 1 | 0 | H | H | H | CH₃ | H | COOCH₃ | H | COOCH₃ | H |
| (75) | polyX-W- | 152 | W-2 | 1 | 0 | H | H | H | CH₃ | COOCH₃ | H | H | COOCH₃ | H |
| (76) | α-W- polyX- | 151 | W-3 | 1 | 0 | H | H | H | CH₃ | COOCH₃ | H | H | COOCH₃ | H |

| Compound | R₂₀ | R₂₁ | R₂₂ | R₂₃ | R₁₅ | R₁₆ | R₁₇ | R₁₈ |
|---|---|---|---|---|---|---|---|---|
| (25) | H | *—S—C₂H₄—C(=O)—O—C₂H₄O— | H | H | H | — | — | — |
| (26) | H | *—S—C₂H₄—C(=O)—O—C₂H₄O— | H | H | H | H | Bu(n) | H |
| (27) | H | *—S—C₂H₄—C(=O)—O—C₂H₄O— | H | H | H | H | Bu(n) | H |

TABLE 1-continued

Compound having bisazo skeleton unit according to the present invention

| # | | | Structure | | | | | |
|---|---|---|---|---|---|---|---|---|
| (28) | H | H | *—S—C₂H₄—C(=O)—O—C₂H₄O— | H | H | H | Bu(n) | H |
| (29) | H | H | *—S—C₂H₄—C(=O)—O—C₂H₄O— | H | H | — | Bu(n) | H |
| (30) | H | H | *—S—C₂H₄—C(=O)—O—C₂H₄O— | H | — | CH₃ | Bu(n) | CH₃ |
| (31) | H | H | *—S—C₂H₄—C(=O)—O—C₂H₄O— | H | H | CH₃ | Bu(n) | H |
| (32) | H | H | *—S—C₂H₄—C(=O)—O—C₂H₄O— | H | H | H | CH₃ | H |
| (33) | H | H | *—S—C₂H₄—C(=O)—O—C₂H₄O— | H | H | H | Bn | H |
| (34) | H | H | *—S—CH(CH₃)—C(=O)—O—C₂H₄O— | H | CH₃ | H | — | — |
| (35) | H | H | *—S—CH(CH₃)—C(=O)—O—C₂H₄O— | H | H | H | Bu(n) | H |

TABLE 1-continued

Compound having bisazo skeleton unit according to the present invention

| | | | | | | | | | |
|---|---|---|---|---|---|---|---|---|---|
| (36) | H | H | | H | H | — | — | — |
| (37) | H | H | | H | H | H | Bu(n) | H |
| (38) | H | H | | H | H | H | Bu(n) | H |
| (39) | H | H | | H | H | H | Bu(n) | H |
| (40) | H | H | | H | H | H | Bu(n) | H |
| (41) | H | H | | H | H | H | Bu(n) | H |
| (42) | H | H | | H | H | H | Bu(n) | H |

TABLE 1-continued

Compound having bisazo skeleton unit according to the present invention

| # | | | | | | | | |
|---|---|---|---|---|---|---|---|---|
| (43) | H | —C₂H₄O—C(=O)—C₆H₄—S—* | H | H | H | H | Bu(n) | H |
| (44) | NHCOC₂H₄S—* | H | NHCOC₂H₄S—* | H | H | — | — | — |
| (45) | H | H₂C(*)—CH—C(=O)—O—C₂H₄— | H | H | H | — | — | — |
| (46) | H | H₂C(*)—CH—C(=O)—O—C₂H₄— | H | H | H | — | — | — |
| (47) | H | H₂C(*)—CH—C(=O)—O—C₂H₄— | H | H | H | H | Bu(n) | H |
| (48) | H | H₂C(*)—CH—C(=O)—O—C₂H₄— | H | H | H | H | Bu(n) | H |
| (49) | H | H₂C(*)—CH—C(=O)—O—C₂H₄— | H | H | — | Bu(n) | H |  |
| (50) | H | H₂C(*)—CH—C(=O)—O—C₂H₄— | H | H | H | H | Bu(n) | H |

TABLE 1-continued

Compound having bisazo skeleton unit according to the present invention

| No. | | Structure | | | | | | |
|---|---|---|---|---|---|---|---|---|
| (51) | H | *—CH₂—CH(H)—C(=O)—O—C₂H₄O—* | H | H | H | — | — | H |
| (52) | H | *—CH₂—CH(H)—C(=O)—O—C₂H₄O—* | H | H | H | — | — | H |
| (53) | H | *—CH₂—CH(H)—C(=O)—O—C₂H₄O—* | H | H | H | — | — | H |
| (54) | H | *—CH₂—CH(H)—C(=O)—O—C₂H₄O—* | H | H | — | H | Bu(n) | H |
| (55) | H | *—CH₂—CH(H)—C(=O)—O—C₂H₄O—* | H | — | H | H | Bu(n) | H |
| (56) | H | *—CH₂—CH(H)—C(=O)—O—C₂H₄O—* | H | H | H | — | — | CH₃ |
| (57) | H | *—CH₂—CH(H)—C(=O)—O—C₂H₄O—* | H | CH₃ | CH₃ | CH₃ | — | H |
| (58) | H | *—CH₂—CH(H)—C(=O)—O—C₂H₄O—* | H | CH₃ | CH₃ | CH₃ | Bn | H |

TABLE 1-continued

Compound having bisazo skeleton unit according to the present invention

| | | | | | | |
|---|---|---|---|---|---|---|
| (59) | H | ![structure] | H | H | H | — |
| (60) | H | ![structure] | H | H | H | — |
| (61) | H | ![structure] | H | H | H | — |
| (62) | H | ![structure] | H | H | H | — |
| (63) | H | ![structure] | H | H | H | — |
| (64) | H | ![structure] | H | H | H | — |
| (65) | H | ![structure] | H | H | H | — |
| (66) | H | ![structure] | H | H | H | — |

Each structure in the third column shows:
$$*-\underset{*}{\underset{|}{C}}H_2-\underset{C_2H_4O-}{\underset{|}{C}}H-C(=O)-*$$

TABLE 1-continued

Compound having bisazo skeleton unit according to the present invention

| | | | | | | |
|---|---|---|---|---|---|---|
| (67) | H | H | H | ![structure: *-CH2-CH(*)-C(=O)-O-C2H4O-] | H | — | — |
| (68) | H | H | H | ![structure] | H | — | — |
| (69) | H | H | H | ![structure] | H | — | — |
| (70) | H | H | H | ![structure] | H | — | — |
| (71) | H | H | H | ![structure] | H | — | — |
| (72) | H | H | H | ![structure] | H | — | — |
| (73) | H | H | H | ![structure] | H | — | — |

TABLE 1-continued

Compound having bisazo skeleton unit according to the present invention

| | | | | | | |
|---|---|---|---|---|---|---|
| (74) | H | ![structure with H₂C-CH-C(=O), *-C₂H₄O-*] | H | H | — | — |
| (75) | H | ![structure with H₂C-CH-C(=O), *-C₂H₄O-*] | H | H | — | — |
| (76) | H | ![structure with H₂C-CH-C(=O), *-C₂H₄O-*] | H | H | — | — |

[wherein X represents formula (3), Y represents formula (4), and Z, W-1, W-2, and W-3 represent the structures below; "Pr" represents an unsubstituted propyl group, "Bu" represents an unsubstituted butyl group, "Ph" represents an unsubstituted phenyl group, "Bn" represents an unsubstituted benzyl group, (n) represents a linear alkyl group, (i) represents a branched alkyl group, and "*" represents a bonding site to the polymer resin unit.]

<Z>

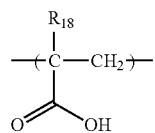

[wherein $R_{18}$ represents a hydrogen atom or an alkyl group.]

<W-1>

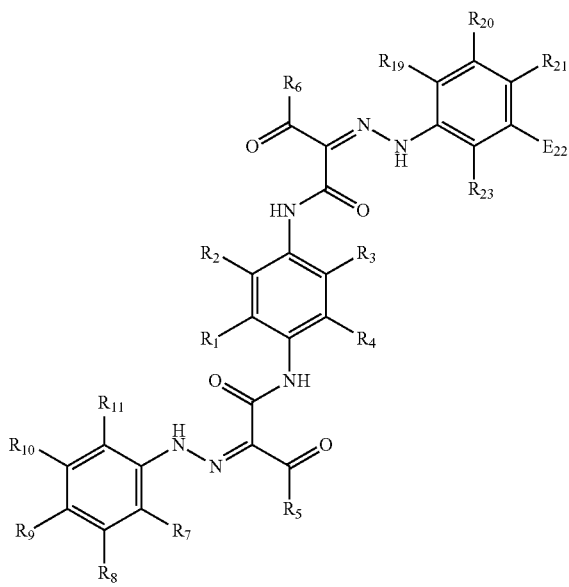

[wherein the linking group $L_1$ is bonded to one of $R_{19}$ to $R_{23}$, and the number of $L_1$ is one or two.]

<W-2>

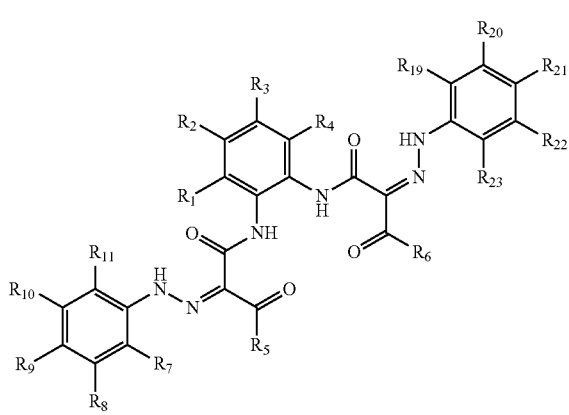

[wherein the linking group $L_1$ is bonded to one of $R_{19}$ to $R_{23}$, and the number of $L_1$ is one or two.]

<W-3>

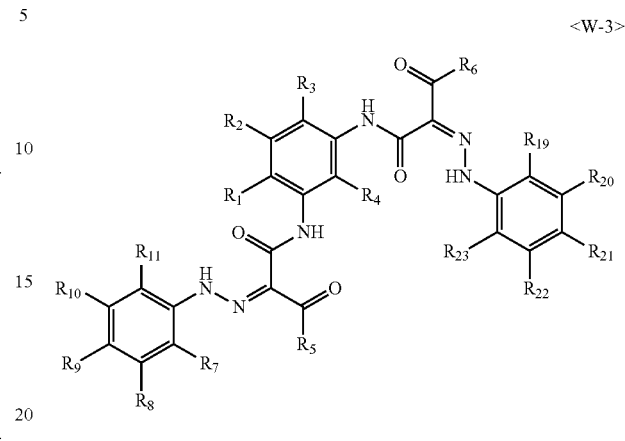

[wherein the linking group $L_1$ is bonded to one of $R_{19}$ to $R_{23}$, and the number of $L_1$ is one or two.]

Comparative Example 1

As Comparative Examples of the bisazo skeleton unit represented by formula (1) or formula (2), azo skeleton units for comparison represented by formulas (91) and (92) were produced according to the production method. Then, the amino group in the unit and the carboxyl group in the polymer resin unit (79) according to Production Example of the compound (25) were amidated to obtain compounds for comparison (91) and (92).

Formula (91)

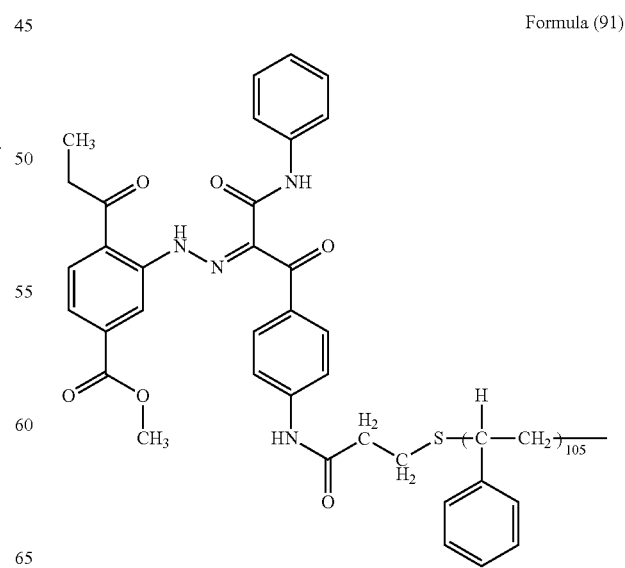

-continued

Formula (92)

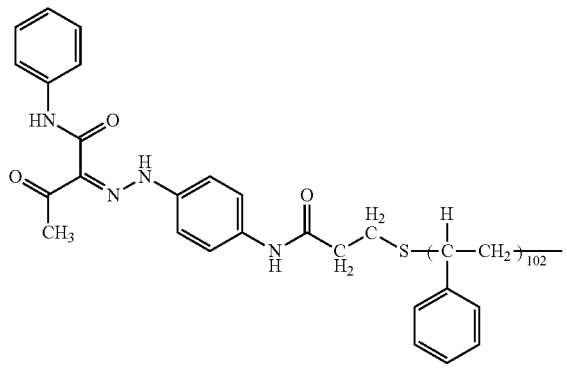

-continued

Formula (94)

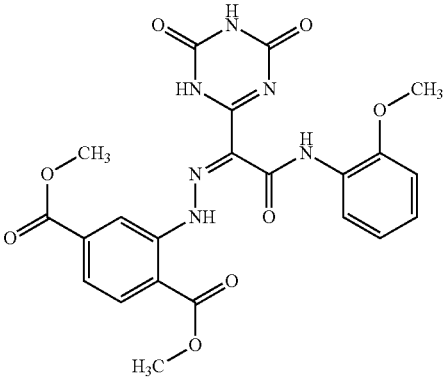

Example 2

The pigment dispersion according to the present invention was prepared by the following method.
<Preparation Example 1 of Pigment Dispersion>
18.0 parts of the pigment represented by formula (6) as the azo pigment, 5.4 parts of the compound (25) having the bisazo skeleton unit, 180 parts of styrene as the water-insoluble solvent, and 130 parts of glass beads (diameter of 1 mm) were mixed, and dispersed for 3 hours by an Attritor [made by NIPPON COKE & ENGINEERING CO., LTD.]. The solution was filtered with a mesh to obtain a pigment dispersion (DIS1).
<Preparation Example 2 of Pigment Dispersion>
The same operation was performed except that the compounds (26) to (76) having the bisazo skeleton unit were used instead of the compound (25) having the bisazo skeleton unit in Preparation Example 1 of the pigment dispersion. Thus, pigment dispersions (DIS2) to (DIS52) were obtained.
<Preparation Example 3 of Pigment Dispersion>
The same operation was performed except that toluene or butyl acrylate was used instead of styrene in Preparation Example 1 in the pigment dispersion. Thus, pigment dispersions (DIS53) and (DIS54) were obtained.
<Preparation Example 4 of Pigment Dispersion>
The same operation was performed except that pigments represented by formulas (93) and (94) were used instead of the pigment represented by formula (6) in Preparation Example 1 in the pigment dispersion. Thus, pigment dispersions (DIS55) and (DIS56) were obtained.

Formula (93)

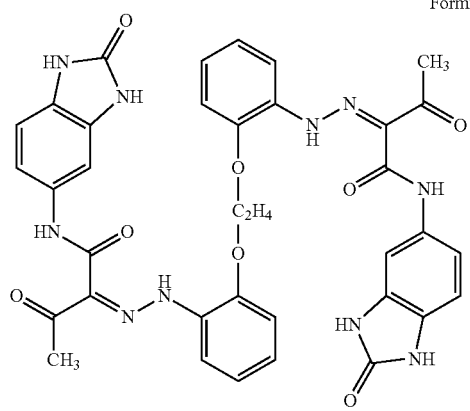

Comparative Example 2

Pigment dispersions providing reference values for evaluation and pigment dispersions for comparison were prepared by the following method.
<Preparation Example 1 of Pigment Dispersion for Reference>
The same operation was performed except that the compound (25) having a bisazo skeleton unit was not added in Preparation Example 1 of the pigment dispersion in Example 2. Thus, a pigment dispersion for reference (DIS57) was obtained.
<Preparation Example 2 of Pigment Dispersion for Reference>
The same operation was performed except that the compound (25) having a bisazo skeleton unit was not added in Preparation Example 3 of the pigment dispersion in Example 2. Thus, pigment dispersions for reference (DIS58) and (DIS59) were obtained.
<Preparation Example 3 of Pigment Dispersion for Reference>
The same operation was performed except that the compound (25) having a bisazo skeleton unit was not added in Preparation Example 4 of the pigment dispersion in Example 2. Thus, pigment dispersions for reference (DIS60) and (DIS61) were obtained.
<Preparation Example 1 of Pigment Dispersion for Comparison>
The same operation was performed except that polymer dispersant Solsperse 24000SC (registered trademark) [made by Lubrizol Corporation] described in PTL 1 and the compounds for comparison (91) and (92) were used instead of the compound (25) having a bisazo skeleton unit in Preparation Example 1 of the pigment dispersion in Example 2. Thus, pigment dispersions for comparison (DIS62) to (DIS64) were obtained.

Example 3

The pigment dispersions using the compound having a bisazo skeleton unit according to the present invention and the pigment dispersions for comparison were evaluated according to the following method.
<Evaluation of Dispersibility of Pigment>
In the compound having a bisazo skeleton unit according to the present invention, the dispersibility of the pigment was evaluated by performing a gloss test of a coating film formed with the pigment dispersion. Namely, the pigment dispersion was extracted by a pipette, and linearly dropped onto on an upper portion of a super art paper [SA Kanefuji 180 kg, 80×160, made by Oji Paper Co., Ltd.]. Using a wire bar (#10), the pigment dispersion was applied uniformly on the art paper. After drying the pigment dispersion, the gloss (reflection angle: 600) was measured with a gloss meter Gloss Meter VG2000 [made by Nippon Denshoku Industries Co., Ltd.]. As the pigment is dispersed more finely, smoothness of the coating film is improved and the gloss is improved. Accordingly, the glosses of the coating films formed with the pigment dispersions (DIS57) to (DIS61) having no pigment dispersant added were used as the reference value, the gloss improving rates of the coating films formed with the pigment dispersions (DIS1) to (DIS56) were evaluated as follows.

A: gloss improving rate is not less than 20%
B: gloss improving rate is not less than 10% and less than 20%
C: gloss improving rate is not less than 1% and less than 10%
D: gloss improving rate is less than 1% or the gloss is reduced If the gloss improving rate was not less than 10%, it was determined that the dispersibility of the pigment was good.

The results of evaluation of the pigment dispersions according to the present invention are shown in Table 2.

Comparative Example 3

The pigment dispersions for reference (DIS57) to (DIS61) and the pigment dispersions for comparison (DIS62) to (DIS64) were evaluated in the same manner as in Example 3. The results of evaluation are shown in Table 2.

TABLE 2

Results of evaluation of pigment dispersions according to the present invention

| Pigment dispersion | Compound | Water-insoluble solvent | Pigment | Dispersibility of pigment |
|---|---|---|---|---|
| (DIS1) | (25) | Styrene | (6) | A |
| (DIS2) | (26) | Styrene | (6) | A |
| (DIS3) | (27) | Styrene | (6) | A |
| (DIS4) | (28) | Styrene | (6) | A |
| (DIS5) | (29) | Styrene | (6) | A |
| (DIS6) | (30) | Styrene | (6) | A |
| (DIS7) | (31) | Styrene | (6) | A |
| (DIS8) | (32) | Styrene | (6) | A |
| (DIS9) | (33) | Styrene | (6) | A |
| (DIS10) | (34) | Styrene | (6) | A |
| (DIS11) | (35) | Styrene | (6) | A |
| (DIS12) | (36) | Styrene | (6) | A |
| (DIS13) | (37) | Styrene | (6) | A |
| (DIS14) | (38) | Styrene | (6) | A |
| (DIS15) | (39) | Styrene | (6) | A |
| (DIS16) | (40) | Styrene | (6) | A |
| (DIS17) | (41) | Styrene | (6) | A |
| (DIS18) | (42) | Styrene | (6) | A |
| (DIS19) | (43) | Styrene | (6) | A |
| (DIS20) | (44) | Styrene | (6) | A |
| (DIS21) | (45) | Styrene | (6) | A |
| (DIS22) | (46) | Styrene | (6) | A |
| (DIS23) | (47) | Styrene | (6) | A |
| (DIS24) | (48) | Styrene | (6) | A |
| (DIS25) | (49) | Styrene | (6) | A |
| (DIS26) | (50) | Styrene | (6) | A |
| (DIS27) | (51) | Styrene | (6) | A |
| (DIS28) | (52) | Styrene | (6) | A |
| (DIS29) | (53) | Styrene | (6) | A |
| (DIS30) | (54) | Styrene | (6) | A |
| (DIS31) | (55) | Styrene | (6) | A |
| (DIS32) | (56) | Styrene | (6) | A |
| (DIS33) | (57) | Styrene | (6) | A |
| (DIS34) | (58) | Styrene | (6) | A |
| (DIS35) | (59) | Styrene | (6) | B |
| (DIS36) | (60) | Styrene | (6) | A |
| (DIS37) | (61) | Styrene | (6) | B |
| (DIS38) | (62) | Styrene | (6) | A |
| (DIS39) | (63) | Styrene | (6) | B |
| (DIS40) | (64) | Styrene | (6) | B |
| (DIS41) | (65) | Styrene | (6) | B |
| (DIS42) | (66) | Styrene | (6) | B |
| (DIS43) | (67) | Styrene | (6) | B |
| (DIS44) | (68) | Styrene | (6) | B |
| (DIS45) | (69) | Styrene | (6) | B |
| (DIS46) | (70) | Styrene | (6) | B |
| (DIS47) | (71) | Styrene | (6) | B |
| (DIS48) | (72) | Styrene | (6) | B |
| (DIS49) | (73) | Styrene | (6) | B |
| (DIS50) | (74) | Styrene | (6) | B |
| (DIS51) | (75) | Styrene | (6) | A |
| (DIS52) | (76) | Styrene | (6) | A |
| (DIS53) | (25) | Toluene | (6) | A |
| (DIS54) | (25) | Butyl acrylate | (6) | A |
| (DIS55) | (25) | Styrene | (93) | B |
| (DIS56) | (25) | Styrene | (94) | B |
| (DIS57) | None | Styrene | (6) | D |
| (DIS58) | None | Toluene | (6) | D |
| (DIS59) | None | Butyl acrylate | (6) | D |
| (DIS60) | None | Styrene | (93) | D |
| (DIS61) | None | Styrene | (94) | D |
| (DIS62) | Solsperse24000SC | Styrene | (6) | D |
| (DIS63) | (91) | Styrene | (6) | D |
| (DIS64) | (92) | Styrene | (6) | D |

From Table 2, it was found that the compound having a bisazo skeleton unit according to the present invention provides an azo pigment dispersion having high dispersibility, and the compound having a bisazo skeleton unit according to the present invention is useful as the azo pigment dispersant.

Example 4

An ink according to the present invention was prepared by the following method.

<Preparation Example 1 of Ink>

The composition shown below and 90.00 parts of glass beads (diameter of 1 mm) were mixed, and dispersed for 3 hours by an Attritor [made by NIPPON COKE & ENGINEERING CO., LTD.]. The dispersion liquid was filtered with a mesh to obtain an ink (INK 1).

| C.I. Pigment Green 36 | 6.00 parts |
|---|---|
| pigment represented by formula (6) | 4.00 parts |
| compound (26) having a bisazo skeleton unit | 2.00 parts |
| diethylene glycol monobutyl ether acetate | 70.00 parts | parts

<Preparation Example 2 of Ink>

The same operation was performed except that the compounds (41), (44), (45), (47), (49), (50), (62), (66), (75), and (76) were used instead of the compound (26) having a bisazo skeleton unit in Preparation Example 1 of the ink. Thus, inks (INK 2) to (INK 11) were obtained.

<Preparation Example 3 of Ink>

The same operation was performed except that the pigment represented by formula (93) and that represented by formula

(94) were used instead of the pigment represented by formula (6) in Preparation Example 1 of the ink. Thus, inks (INK 12) and (INK 13) were obtained.

Comparative Example 4

Inks providing reference values for evaluation and inks for comparison were prepared by the following method.
<Preparation Example 1 of Ink for Reference>
The same operation was performed except that the compound (26) having a bisazo skeleton unit was not added in Preparation Example 1 of the ink in Example 4. Thus, an ink for reference (INK 14) was obtained.
<Preparation Example 2 of Ink for Reference>
The same operation was performed except that the compound (26) having a bisazo skeleton unit was not added in Preparation Example 3 of the ink in Example 4. Thus, inks for reference (INK 15) and (INK 16) were obtained.
<Preparation Example 1 of Ink for Comparison>
The same operation was performed except that the polymer dispersant Solsperse 24000SC (registered trademark) [made by Lubrizol Corporation] described in PTL 1, the compounds for comparison (91) and (92) were used instead of the compound (26) having a bisazo skeleton unit in Preparation Example 1 of the ink in Example 4. Thus, inks for comparison (INK 17) to (INK 19) were obtained.

Example 5

The resist composition for a color filter according to the present invention was prepared by the following method.
<Preparation Example 1 of Resist Composition for Color Filter>
A solution including the components shown below was slowly added to the ink (INK 1) obtained in Example 4, and stirred at room temperature for 3 hours. The solution was filtered with a 1.5 μm filter to obtain a resist composition for a color filter (REG1).

| | |
|---|---|
| methylated benzoguanamine resin [made by SANWA Chemical Co., Ltd.] (binder resin) | 15.0 parts |
| diethylene glycol monobutyl ether acetate | 40.00 parts |

<Preparation Example 2 of Resist Composition for Color Filter>
The same operation was performed except that the inks (INK 2) to (INK 11) were used instead of the ink (INK 1) in Preparation Example 1 of the resist composition for a color filter. Thus, resist compositions for a color filter (REG2) to (REG11) were obtained.
<Preparation Example 3 of Resist Composition for Color Filter>
The same operation was performed except that the inks (INK 12) and (INK 13) were used instead of the ink (INK 1) in Preparation Example 1 of the resist composition for a color filter. Thus, resist compositions for a color filter (REG12) and (REG13) were obtained.

Comparative Example 5

Resist compositions for a color filter providing reference values for evaluation and resist compositions for a color filter for comparison were prepared by the following method.

<Preparation Example 1 of Resist Composition for Color Filter for Reference>
The same operation was performed except that the ink (INK 14) was used instead of the ink (INK 1) in Preparation Example 1 of the resist composition for a color filter in Example 5. Thus, a resist composition for a color filter for reference (REG14) was obtained.
<Preparation Example 2 of Resist Composition for Color Filter for Reference>
The same operation was performed except that the inks (INK 15) and (INK 16) were used instead of the ink (INK 1) in Preparation Example 1 of the resist composition for a color filter in Example 5. Thus, resist compositions for a color filter for reference (REG15) and (REG16) were obtained.
<Preparation Example 1 of Resist for Color Filter for Comparison>
The same operation was performed except that the inks (INK 17) to (INK 19) were used instead of the ink (INK 1) in Preparation Example 1 of the resist for a color filter in Example 5. Thus, resists for a color filter for comparison (REG17) to (REG19) were obtained.

Example 6

The resist compositions for a color filter using the compound having a bisazo skeleton unit according to the present invention and the resists for a color filter for comparison were evaluated according to the following method.
<Evaluation of Color Properties>
In the resist composition for a color filter using compound having a bisazo skeleton unit according to the present invention, the color properties were evaluated by ejecting the resist composition onto a glass substrate using an inkjet coating test machine, and performing a lightness test. Namely, the resist composition for a color filter described in Example 5 was filled into a cartridge, ejected onto a glass substrate in which a black matrix was formed to form pixels, and dried at 180° C. for 2 hours. The film thickness of a green filter was adjusted so as to be y=0.6, and the color properties (x,y,Y) were measured by a microspectrophotometer. As the pigment is dispersed more finely, the lightness Y in the chromaticity of green is improved. Accordingly, the lightnesses Y of the green filters formed with the resist compositions for a color filter (REG15) to (REG16) having no added compound having bisazo skeleton were used as the reference value, and the improving rate of the lightness Y in the green filters formed with the resist compositions for a color filter (REG1) to (REG14) was evaluated as follows.
A: lightness improving rate is not less than 20%
B: lightness improving rate is not less than 10% and less than 20%
C: lightness improving rate is not less than 1% and less than 10%
D: lightness improving rate is less than 1% or the reference value If the lightness improving rate was not less than 10%, it was determined that the resist composition had high color properties.

The results of evaluation of the resist compositions for a color filter according to the present invention are shown in Table 3.

Comparative Example 6

The resist compositions for a color filter for reference (REG15) and (REG16) and the resist compositions for a color filter for comparison (REG17) to (REG19) were evaluated in the same manner as in Example 6. The results of evaluation are shown in Table 3.

TABLE 3

Results of evaluation of resist composition for color filter

| Resist composition | Ink | Compound | Pigment | Color properties |
|---|---|---|---|---|
| (REG1) | (INK1) | (26) | (6) | A |
| (REG2) | (INK2) | (41) | (6) | A |
| (REG3) | (INK3) | (44) | (6) | A |
| (REG4) | (INK4) | (45) | (6) | A |
| (REG5) | (INK5) | (47) | (6) | A |
| (REG6) | (INK6) | (49) | (6) | A |
| (REG7) | (INK7) | (50) | (6) | A |
| (REG8) | (INK8) | (62) | (6) | A |
| (REG9) | (INK9) | (66) | (6) | B |
| (REG10) | (INK10) | (75) | (6) | A |
| (REG11) | (INK11) | (75) | (6) | A |
| (REG12) | (INK12) | (26) | (93) | B |
| (REG13) | (INK13) | (26) | (94) | B |
| (REG14) | (INK14) | None | (6) | D |
| (REG15) | (INK15) | None | (93) | D |
| (REG16) | (INK16) | None | (94) | D |
| (REG17) | (INK17) | Sol sperse24000SC | (6) | D |
| (REG18) | (INK18) | (91) | (6) | D |
| (REG19) | (INK19) | (92) | (6) | D |

From Table 3, it was found that in the resist composition for a color filter according to the present invention, the pigment is dispersed well and the color properties are high, and therefore the pigment dispersion according to the present invention is useful as the colorant for the ink and the resist composition for a color filter.

INDUSTRIAL APPLICABILITY

The compound having at least the bisazo skeleton represented by formula (1) or formula (2) according to the present invention is particularly suitably used as the dispersant for dispersing the azo pigment in the water-insoluble solvent. Moreover, the compound having a bisazo skeleton unit represented by formula (1) or formula (2) according to the present invention can be used not only as the pigment dispersant, but also as a dye for oil coating materials, heat-sensitive transfer recording sheets, colorants for writing oil inks, and photorecording media.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-224613, filed Oct. 12, 2011, which is hereby incorporated by reference herein in its entirety.

The invention claimed is:

1. A compound containing a polymer unit to which a unit represented by formula (1) or (2) is bound, wherein said polymer unit has at least one of partial structures represented by formulae (3) and (4):

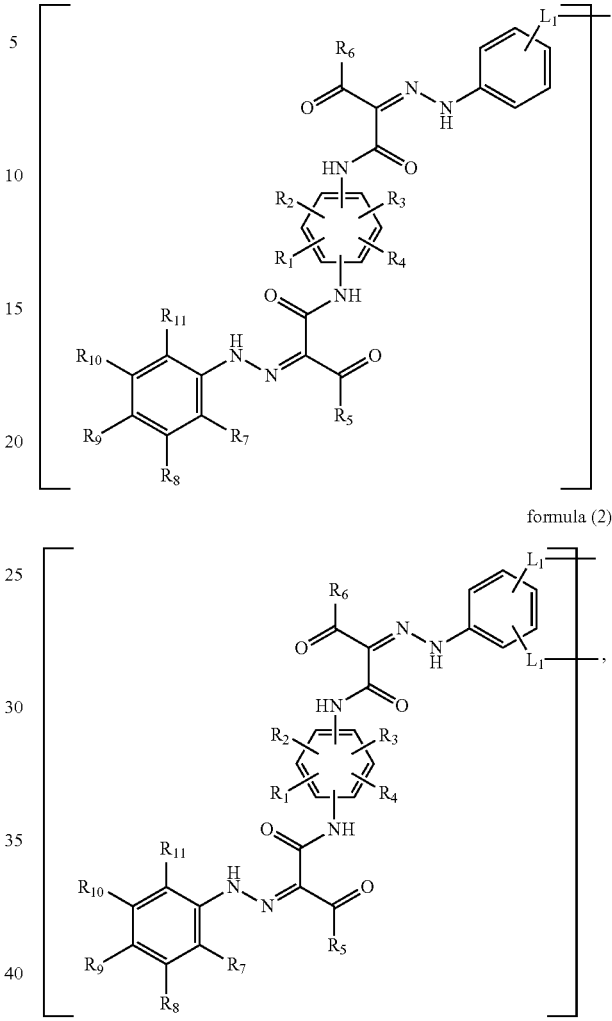

wherein $R_1$ to $R_4$ represent a hydrogen atom or a halogen atom, $R_5$ and $R_6$ represent an alkyl group having 1 to 6 carbon atoms or a phenyl group, $R_7$ to $R_{11}$ represent a hydrogen atom, a $COOR_{12}$ group, or a $CONR_{13}R_{14}$ group, at least one of $R_7$ to $R_{11}$ is a $COOR_{12}$ group or a $CONR_{13}R_{14}$ group, and $R_{12}$ to $R_{14}$ represent a hydrogen atom or an alkyl group having 1 to 3 carbon atoms, and $L_1$ represents a divalent linking group;

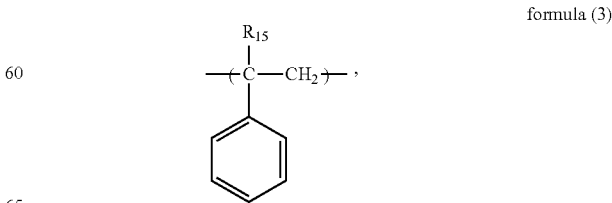

wherein $R_{15}$ represents a hydrogen atom or an alkyl group;

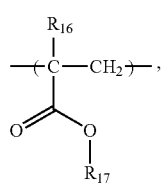

formula (4)

wherein $R_{16}$ represents a hydrogen atom or an alkyl group, and $R_{17}$ represents a hydrogen atom, an alkyl group, or an aralkyl group.

2. The compound according to claim 1, wherein $R_5$ and $R_6$ are a methyl group.

3. The compound according to claim 1, wherein $R_8$ and $R_{11}$ are $COOR_{12}$, $R_{12}$ represents a hydrogen atom or an alkyl group having 1 to 3 carbon atoms, and $R_8$, $R_9$, and $R_{11}$ are a hydrogen atom.

4. The compound according to claim 1, wherein $L_1$ bonds to the polymer unit by a carboxylic acid ester bond or a carboxylic acid amide bond.

5. The compound according to claim 1, wherein the unit represented by formula (1) bonds to the polymer unit, and the bonding unit is represented by formula (5):

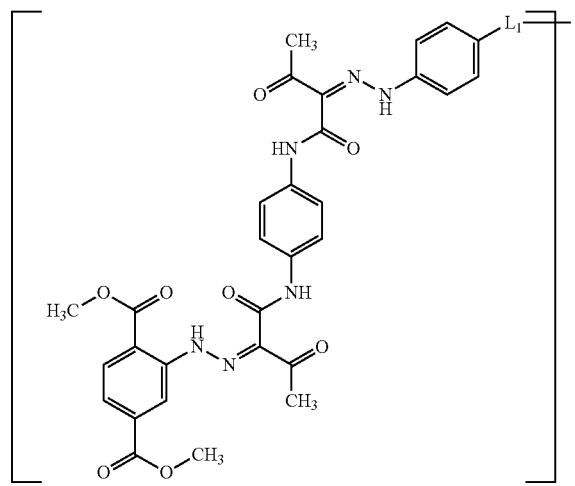

formula (5)

wherein $L_1$ represents a divalent linking group.

6. A pigment dispersant comprising a compound according to claim 1.

7. A pigment composition comprising a compound according to claim 1 and an azo pigment.

8. The pigment composition according to claim 7, wherein the azo pigment is an acetoacetanilide pigment.

9. The pigment composition according to claim 7, wherein the azo pigment is an azo pigment represented by formula (6):

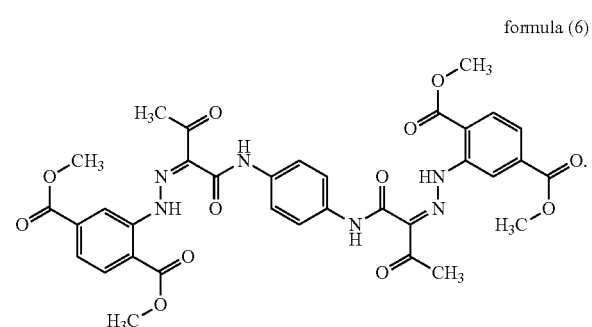

formula (6)

10. A pigment dispersion comprising the pigment composition according to claim 7 and a water-insoluble solvent.

11. An ink comprising at least one pigment dispersion according to claim 10.

12. A resist composition for a color filter comprising at least one pigment dispersion according to claim 10.

* * * * *